United States Patent
Kim et al.

(10) Patent No.: US 9,904,753 B2
(45) Date of Patent: Feb. 27, 2018

(54) METHODS FOR DESIGNING A LAYOUT OF A SEMICONDUCTOR DEVICE INCLUDING AT LEAST ONE RISK VIA

(71) Applicants: Byung-Moo Kim, Hwaseong-si (KR); Seung Weon Paek, Yongin-si (KR)

(72) Inventors: Byung-Moo Kim, Hwaseong-si (KR); Seung Weon Paek, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 126 days.

(21) Appl. No.: 14/991,330

(22) Filed: Jan. 8, 2016

(65) Prior Publication Data
US 2016/0283634 A1    Sep. 29, 2016

(30) Foreign Application Priority Data

Mar. 27, 2015  (KR) .................. 10-2015-0042899
Jun. 19, 2015  (KR) .................. 10-2015-0087643

(51) Int. Cl.
G06F 17/50      (2006.01)
H01L 27/11582   (2017.01)
H01L 27/02      (2006.01)
H01L 21/768     (2006.01)

(52) U.S. Cl.
CPC ...... *G06F 17/5072* (2013.01); *G06F 17/5068* (2013.01); *H01L 27/11582* (2013.01); *H01L 21/76807* (2013.01); *H01L 21/76816* (2013.01); *H01L 27/0207* (2013.01)

(58) Field of Classification Search
CPC ........................................................ G06F 17/50
USPC .......................................................... 716/55
See application file for complete search history.

(56) References Cited

U.S. PATENT DOCUMENTS 7,673,258 B2      3/2010  Kyoh
2016/0063167 A1*  3/2016  Hamouda ........... G06F 17/5081
                                                        716/122

FOREIGN PATENT DOCUMENTS

KR       10-0889112 B1      3/2009

* cited by examiner

*Primary Examiner* — Thuan Do
(74) *Attorney, Agent, or Firm* — Myers Bigel, P.A.

(57) ABSTRACT

A method of designing a layout of a semiconductor device includes preparing a layout for a semiconductor integrated circuit, the preparing of the layout including providing lower and upper metal patterns and via patterns, which are vertically interposed between the lower and upper metal patterns, performing a retargeting process on the lower and upper metal patterns, classifying the via patterns to extract at least one risk via from the via patterns and changing a position of the risk via. During the changing of the position of the risk via, all of the via patterns, other than the risk via, are unchanged in position thereof. Related systems and computer program products are disclosed.

16 Claims, 23 Drawing Sheets

2000

3000

METHODS FOR DESIGNING A LAYOUT OF A SEMICONDUCTOR DEVICE INCLUDING AT LEAST ONE RISK VIA

CROSS-REFERENCE TO RELATED APPLICATIONS

This U.S. non-provisional patent application claims priority under 35 U.S.C. §119 to Korean Patent Applications No. 10-2015-0042899, filed on Mar. 27, 2015, and No. 10-2015-0087643, filed on Jun. 19, 2015, in the Korean Intellectual Property Office, the entire contents of which are hereby incorporated by reference.

BACKGROUND

Example embodiments of the inventive concepts relate to methods of designing a layout of a semiconductor device, for example, to methods of designing a layout of a semiconductor device including a field effect transistor, methods of fabricating a semiconductor device using the same, and computer systems and program products configured to perform the designing of the layout.

Due to their small-sized, multifunctional, and/or low-cost characteristics, semiconductor devices are widely used elements in the electronic industry. The semiconductor devices may be classified into a memory device for storing data, a logic device for processing data, a hybrid device including both memory and logic elements and/or other semiconductor devices. To meet the increased demand for electronic devices with fast speed and/or low power consumption, it is desirable to realize semiconductor devices with high reliability, high performance, and/or multiple functions. To satisfy these technical requirements, complexity and/or integration density of semiconductor devices are being increased.

SUMMARY

According to example embodiments of the inventive concepts, a method of designing a layout of a semiconductor device may include preparing a layout for a semiconductor integrated circuit, the preparing of the layout including providing lower and upper metal patterns and via patterns, which are vertically interposed between the lower and upper metal patterns, performing a retargeting process on the lower and upper metal patterns, classifying the via patterns to extract at least one risk via from the via patterns, the at least one risk via being less than all of the via patterns, and changing a position of the at least one risk via. During the changing of the position of the at least one risk via, all of the via patterns other than the at least one risk via, may be unchanged in position thereof.

In some embodiments, the retargeting process may include correcting shapes and positions of the lower and upper metal patterns, based on a process error resulting from an optical proximity effect in a photolithography process.

In some embodiments, after the retargeting process, the method may further include forming a pseudo contour from the lower and upper metal patterns, based on an etch skew, and the classifying of the via patterns may be performed, based on the pseudo contour.

In some embodiments, the classifying of the via patterns may include defining one of the via patterns as the risk via, when a distance between a first edge of the one of the via patterns and a second edge of the upper metal pattern that overlaps the one of the via patterns is smaller than a predetermined distance or has a negative value. The first and second edges may be parallel and adjacent to each other, and the negative value may be a value when a portion including the first edge of the risk via protrudes from the second edge.

In some embodiments, the classifying of the via patterns may include defining one of the via patterns as one risk via, when a distance between the one of the via patterns and the lower metal pattern adjacent thereto is smaller than a predetermined distance.

In some embodiments, the classifying of the via patterns may include defining one of the via patterns as the risk via, when a distance between the one of the via patterns and the upper metal pattern adjacent thereto is smaller than a predetermined distance.

In some embodiments, the classifying of the via patterns may include detecting a first weak edge having a process risk, from edges of the via patterns and defining one of the via patterns with the first weak edge as the risk via. The changing of the position of the at least one risk via may include moving the risk via in a first direction that is not parallel to the first weak edge and is oriented toward a center of the risk via.

In some embodiments, the risk via may further include a second weak edge with a process risk, and the changing of the position of the at least one risk via may further include moving the risk via in a second direction that is not parallel to the second weak edge and is oriented toward the center of the risk via.

In some embodiments, a distance between the first weak edge and a side of the lower or upper metal pattern adjacent thereto may be smaller than a distance that is determined based on the process risk.

In some embodiments, the method may further include performing a design-rule check on the one risk via, after the changing of the position of the at least one risk via. The performing of the design-rule check may include examining whether a distance between an edge of the one risk via facing the first weak edge and an edge of the lower or upper metal pattern adjacent to the edge is smaller than a distance that is determined based on the process risk. The lower or upper metal pattern may overlap with the one risk via.

In some embodiments, the method may further include further changing the position of the one risk via, when an additional process risk is found in the design-rule check.

In some embodiments, the at least one risk via may include a plurality of risk vias, at least two of which overlap one of the lower and upper metal patterns.

In some embodiments, the method may further include manufacturing a photomask using the layout including the at least one risk via, the position of which was changed, and fabricating the semiconductor device from the photomask According to other example embodiments of the inventive concepts, a method of designing a layout of a semiconductor device may include preparing a layout including lower and upper metal patterns and via patterns therebetween, detecting a first weak edge having a process risk, from edges of the via patterns, and moving one of the via patterns with the first weak edge in a direction. The direction may be a direction that is not parallel to the first weak edge and is oriented toward a center of the via pattern.

In some embodiments, the method may further include correcting shapes and positions of the lower and upper metal patterns based on a process error resulting from an optical proximity effect in a photolithography process, before the detecting of the first weak edge.

In some embodiments, the detecting of the first weak edge may include defining a first edge of the one of the via patterns as the first weak edge, when a distance between the first edge and a second edge of the upper metal pattern that overlaps the one of the via patterns is smaller than a predetermined distance or has a negative value. Here, the first and second edges may be parallel and adjacent to each other, and the negative value may be a value, when a portion including the first edge of the one of the via patterns protrudes from the second edge.

In some embodiments, the detecting of the first weak edge may include defining a first edge of the one of the via patterns as the first weak edge, when a distance between the first edge and a third edge of the lower metal pattern adjacent to the first edge is smaller than a predetermined distance. Here, the first and third edges may be parallel to each other.

In some embodiments, the detecting of the first weak edge may include defining a first edge of the one of the via patterns as the first weak edge, when a distance between the first edge and a fourth edge of the upper metal pattern adjacent to the first edge is smaller than a predetermined distance. Here, the first and fourth edges may be parallel to each other.

In some embodiments, the method may further include defining the via pattern with the first weak edge as a risk via. During the moving of the risk via, all of the via patterns, other than the risk via, may be unchanged in position thereof.

In some embodiments, the method further comprises manufacturing a photomask using the layout including the via pattern with the weak edge that was moved in the direction, and fabricating the semiconductor device from the photomask.

According to example embodiments of the inventive concepts, a method of fabricating a semiconductor device may include designing a layout for a semiconductor device, manufacturing a photomask using the layout, and forming vias and lower and upper metal lines, which are vertically connected to each other by the vias, on a substrate using the photomask. The designing of the layout may include preparing a layout including lower and upper metal patterns and via patterns, which are vertically interposed between the lower and upper metal patterns, performing a retargeting process on the lower and upper metal patterns, classifying the via patterns to extract at least one risk via from the via patterns, and changing a position of the at least one risk via, while preventing all of the via patterns, other than the at least one risk via, from being moved from their original positions.

In some embodiments, the classifying of the via patterns may include defining one of the via patterns as one risk via, when a distance between a first edge of the one of the via patterns and a second edge of the upper metal pattern that overlaps the one of the via patterns is smaller than a predetermined distance or has a negative value. Here, the first and second edges may be parallel and adjacent to each other, and the negative value may be a value when a portion including the first edge of the one risk via protrudes from the second edge.

In some embodiments, the predetermined distance may be based on a maximum edge-to-edge distance, allowing for the lower metal line to be not exposed by a via hole, when the via hole is formed using the photomask.

In some embodiments, the classifying of the via patterns may include defining one of the via patterns as the one risk via, when a distance between the one of the via patterns and the lower metal pattern adjacent thereto is smaller than a predetermined distance.

In some embodiments, the predetermined distance may be based on a maximum edge-to-edge distance, allowing for one of the lower metal lines to be in contact with a via adjacent thereto, when the via is formed using the photomask.

In some embodiments, the classifying of the via patterns may include defining one of the via patterns as one risk via, when a distance between the one of the via patterns and one of the upper metal patterns adjacent thereto is smaller than a predetermined distance.

In some embodiments, the predetermined distance may be based on a maximum edge-to-edge distance, allowing for one of the upper metal lines to be in contact with a via adjacent thereto, when the via is formed using the photomask.

Other example embodiments of the inventive concepts include a method of designing a layout of a semiconductor device that comprises first and second metal patterns and a via pattern therebetween that comprises vias, the method comprising changing a position of a subset of the vias in the via pattern, relative to remaining vias in the via pattern, based on a process risk factor, the subset including at least one, but less than all, of the vias in the via pattern.

In some embodiments, the risk factor comprises a distance between an edge of a via in the via pattern and an edge of the first and/or second metal pattern that overlaps the via in the via pattern being less than a threshold.

In other embodiments, the method further comprises forming a pseudo contour from the first and second metal patterns based on an etch skew, wherein the process risk factor is based on the pseudo contour.

In some embodiments, the changing comprises moving the position of a respective risk via toward a center of the respective risk via.

In some embodiments, the method further comprises manufacturing a photomask using the layout including the position of the subset of the vias in the via pattern that was changed and fabricating the semiconductor device from the photomask.

According to other example embodiments of the inventive concepts, a computer system may be configured to execute a layout design program for designing a layout of a semiconductor integrated circuit. The computer system may include a working memory, which is configured to load the layout design program and/or a verification program for performing a design-rule check on a layout prepared by the layout design program, and a central processing unit, which is configured to execute the layout design program and/or the verification program. The layout design program may be configured to perform sequences of preparing a layout including lower and upper metal patterns and via patterns, which are vertically interposed between the lower and upper metal patterns, retargeting the lower and upper metal patterns, classifying the via patterns to extract at least one risk via from the via patterns, and changing a position of the risk via, while preventing all of the via patterns, other than the risk via, from being moved from their original positions, and thereby to prepare the layout of the semiconductor integrated circuit.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
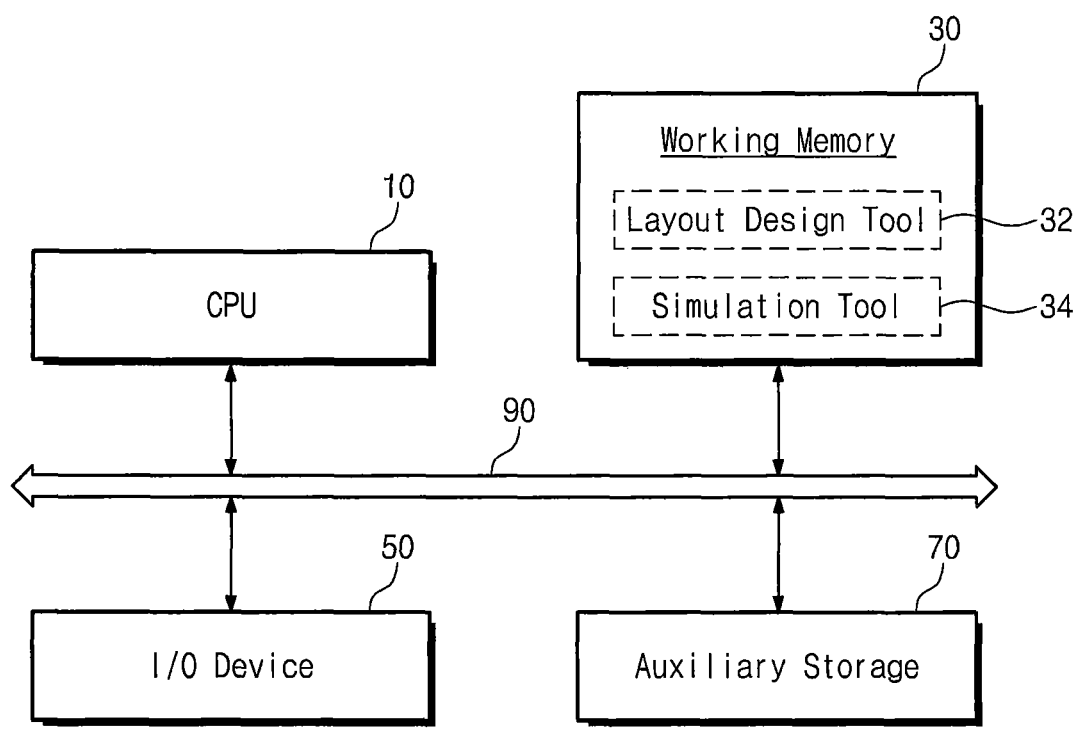
FIG. 1 is a block diagram illustrating a computer system for designing a semiconductor device, according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," and variants thereof if used herein, specify the presence of stated features, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Some embodiments are described herein with reference to flowchart illustrations and/or block diagrams of methods, systems and computer program products according to various embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create a mechanism for implementing the functions/acts specified in the flowchart and/or block diagram block or blocks.

These computer program instructions may also be stored in a non-transitory computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

FIG. 1 is a block diagram illustrating a computer system for performing a semiconductor design process, according to example embodiments of the inventive concepts. Referring to FIG. 1, a computer system may include a central processing unit (CPU) 10, a working memory 30, an input-output device 50, and a storage device 70. In example embodiments, the computer system may be provided in the form of a customized system for performing a layout design process according to example embodiments of the inventive concepts. Furthermore, the computer system may include a computing system configured to carry out various design and check simulation programs.

The CPU 10 may be configured to run a variety of softwares, such as application programs, operating systems, and device drivers. For example, the CPU 10 may be configured to run an operating system (not shown) loaded on the working memory 30. Further, the CPU 10 may be configured to run various application programs on the operating system. For example, the CPU 10 may be configured to run a layout design tool 32 loaded on the working memory 30.

The operating system or application programs may be loaded on the working memory 30. For example, when the computer system starts a booting operation, an OS image (not shown) stored in the storage device 70 may be loaded on the working memory 30 according to a booting sequence. In the computer system, overall input/output operations may be managed by the operating system. Similarly, some application programs, which may be selected by a user or be provided for basic services, may be loaded on the working memory 30. According to example embodiments of the inventive concepts, the layout design tool 32 prepared for a layout design process may be loaded on the working memory 30, from the storage device 70.

The layout design tool 32 may provide a function for changing biasing data for specific layout patterns; for example, the layout design tool 32 may be configured to allow the specific layout patterns to have shapes and positions different from those defined by a design rule. The layout design tool 32 may be configured to perform a design rule check (DRC) under the changed condition of the biasing data. The working memory 30 may be volatile memory devices (e.g., static random access memory (SRAM), dynamic random access memory (DRAM) devices) and/or nonvolatile memory devices (e.g., PRAM, MRAM, ReRAM, FRAM, NOR FLASH memory devices).

In addition, a simulation tool 34 may be loaded in the working memory 30 to perform an optical proximity correction (OPC) operation on the designed layout data.

The input-output device 50 may be configured to control user input and output operations of user interface devices. For example, the input-output device 50 may include a keyboard and/or a monitor, allowing a designer to input and/or view relevant information. By using the input-output device 50, the designer may receive information on a semiconductor region or data paths, to which adjusted operating characteristics will be applied. The input-output device 50 may be configured to display a progress status or a process result of the simulation tool 34.

The storage device 70 may serve as a storage medium for the computer system. The storage device 70 may be configured to store application programs, an OS image, and/or various data. The storage device 70 may be provided in the form of memory cards (e.g., MMC, eMMC, SD, MicroSD, and so forth) and/or a hard disk drive (HDD). The storage device 70 may include a NAND FLASH memory device with a large memory capacity. The storage device 70 may also or alternatively include next-generation nonvolatile memory devices (e.g., PRAM, MRAM, ReRAM, or FRAM) or NOR FLASH memory devices.

A system interconnector 90 may be provided to serve as a system bus for realizing a network in the computer system. The CPU 10, the working memory 30, the input-output device 50, and the storage device 70 may be electrically connected to each other through the system interconnector 90, and thus, data may be exchanged therebetween. However, the system interconnector 90 may not be limited to the afore-described configuration; for example, it may further include an additional element for increasing efficiency in data communication.

Figure 2:
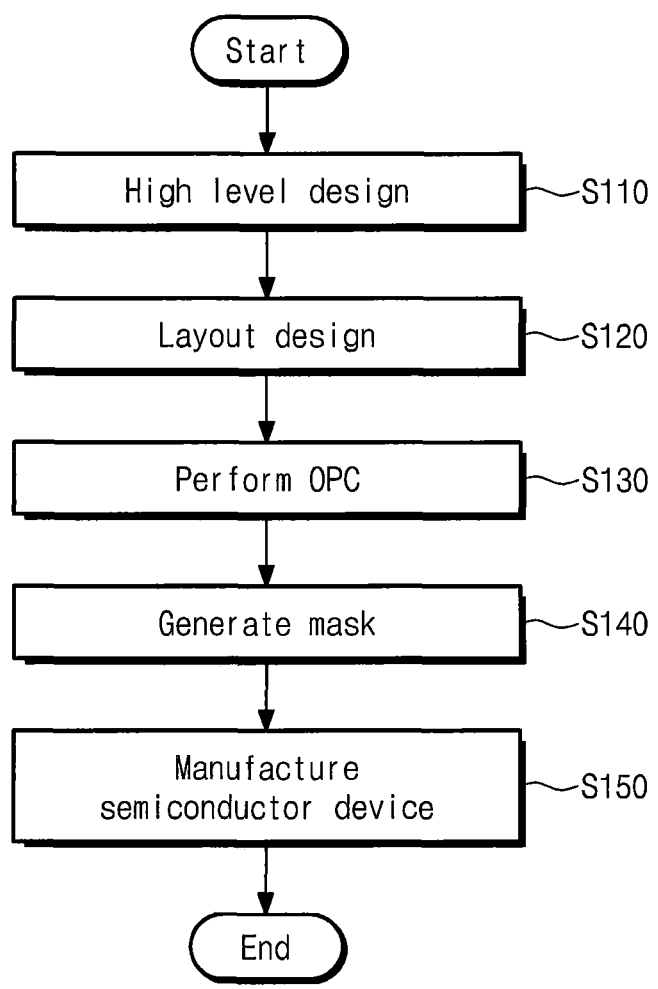
FIG. 2 is a flow chart illustrating designing and fabricating a semiconductor device, according to example embodiments of the inventive concepts.

FIG. 2 is a flow chart illustrating designing and fabricating a semiconductor device, according to example embodiments of the inventive concepts.

Referring to FIG. 2, a high-level design process for a semiconductor integrated circuit may be performed using the computer system described with reference to FIG. 1 (in S110). For example, in the high-level design process, an integrated circuit to be designed may be described in terms of high-level computer language (e.g., C language). Circuits designed by the high-level design process may be more concretely described by a register transfer level (RTL) coding or a simulation. Further, codes generated by the RTL coding may be converted into a netlist, and the results may be combined with each other to wholly describe a semiconductor device. The combined schematic circuit may be verified by a simulation tool. In certain embodiments, an adjusting step may be further performed, in consideration of a result of the verification step.

A layout design process may be performed to realize a logically complete form of the semiconductor integrated circuit on a wafer (in S120). For example, the layout design process may be performed in consideration of the schematic circuit prepared in the high-level design process or the corresponding netlist. The layout design process may include a routing step of placing and connecting several cells provided from a cell library, based on a predetermined design rule. The layout design process according to example embodiments of the inventive concepts may include a biasing step of extracting information on at least one (e.g., risk vias) of the via patterns, which are likely to have a process risk, and then adjusting positions thereof.

The cell library may contain information on operation, speed, and power consumption of cells. In certain embodiments, a cell library for representing a layout of a circuit in a gate level may be defined in the layout design tool. Here, the layout may be prepared to define or describe shapes or dimensions of patterns constituting transistors and metal lines, which will be actually formed on a wafer. For example, in order to actually form an inverter circuit on a wafer, it is necessary to prepare or draw a layout for patterns (e.g., PMOS, NMOS, N-WELL, gate electrodes, and metal lines thereon). For this, a suitable one of inverters contained in the cell library may be selected. Thereafter, a routing step of connecting the selected or provided cells to each other may be performed. These steps may be automatically or manually performed in the layout design tool.

After the routing step, a verification step of checking whether there is a portion violating the given design rule may be performed on the layout. In example embodiments, the verification step may include evaluating verification items, such as a design rule check (DRC), an electrical rule check (ERC), and/or a layout vs. schematic (LVS). The evaluating of the DRC item may be performed to evaluate whether the layout meets the given design rule. The evaluating of the ERC item may be performed to evaluate whether there is an issue of electrical disconnection in the layout. The evaluating of the LVS item may be performed to evaluate whether the layout is prepared to coincide with the gate-level netlist.

An optical proximity correction (OPC) step may be performed (in S130). The OPC step may be performed to correct optical proximity effects, which may occur when a photolithography process will be performed on a wafer using a photomask manufactured based on the layout. The optical proximity effect may be an unintended optical effect (such as refraction or diffraction) which may occur in the exposing process using the photomask manufactured based on the layout. In the OPC step, the layout may be modified to have a reduced difference in shape between designed patterns and actually-formed patterns, which may be caused by the optical proximity effects. As a result of the optical proximity correction step, the designed shapes and positions of the layout patterns may be slightly changed.

A photomask may be manufactured, based on the layout modified by the OPC (in S140). In general, the photomask may be manufactured by patterning a chromium layer provided on a glass substrate based on the layout pattern data.

The manufactured photomask may be used to fabricate a semiconductor device (in S150). A plurality of exposing and etching steps may be repeatedly performed during the fabrication process, and thus, patterns defined in the layout design process may be sequentially formed on a semiconductor substrate.

Figure 3:
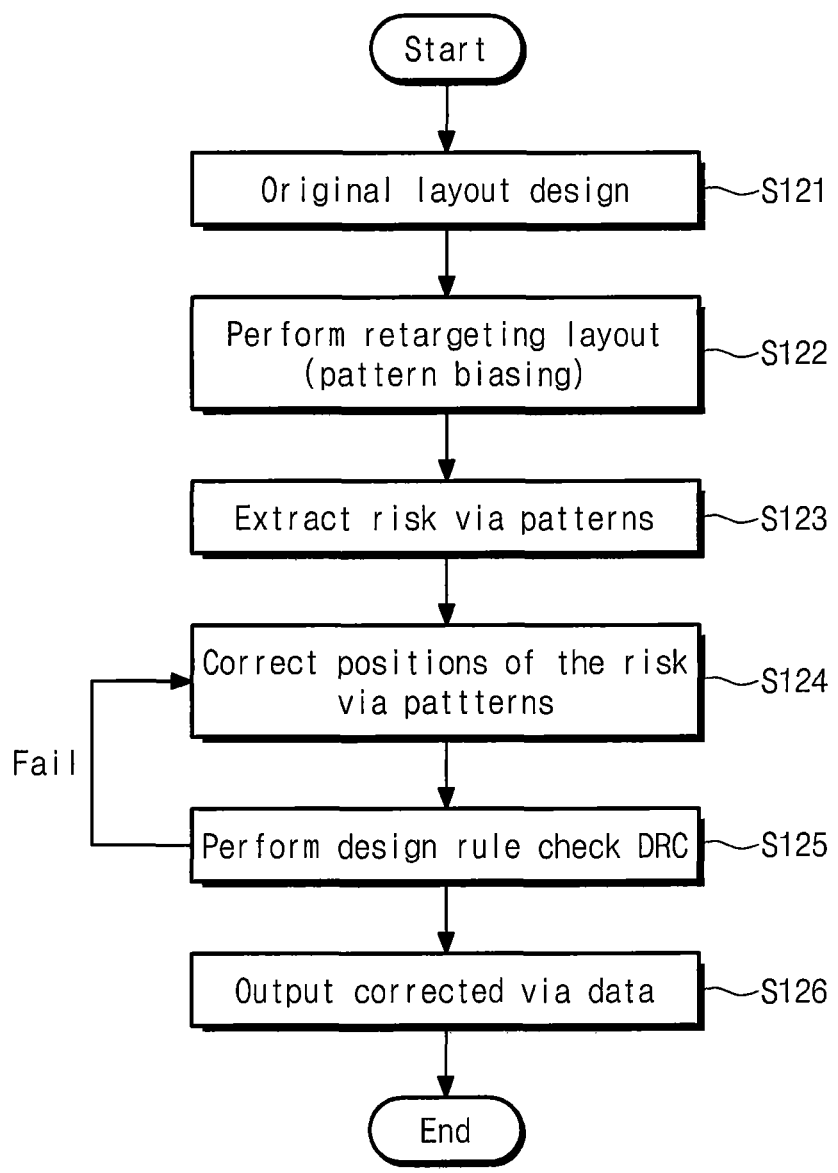
FIG. 3 is a flow chart illustrating a layout design of FIG. 2, according to example embodiments of the inventive concepts.

FIG. 3 is a flow chart illustrating a layout design S120 of FIG. 2, according to example embodiments of the inventive concepts. FIGS. 4 through 7 are plan views illustrating correcting positions of via layout patterns, which are presented as an example of layout patterns for describing designing a metal layout according to example embodiments of the inventive concepts. For example, FIGS. 4 through 7 may illustrate layouts for realizing first and second metal layers sequentially formed on a semiconductor substrate and vias interposed therebetween.

Figure 4:
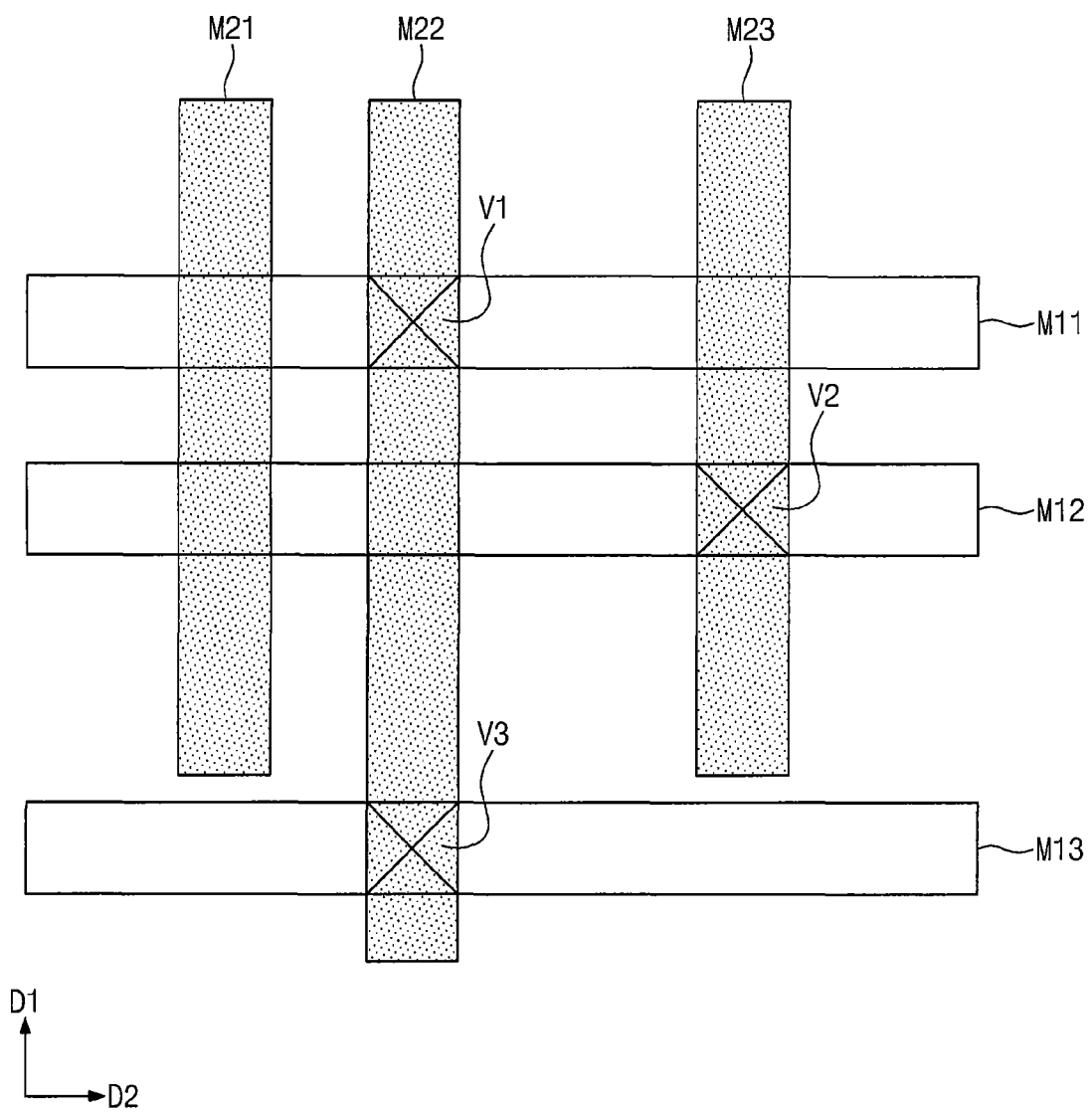
FIGS. 4 through 7 are plan views illustrating a method of correcting positions of via layout patterns, which are presented as an example of layout patterns for describing a method of designing a metal layout according to example embodiments of the inventive concepts.

Referring to FIGS. 3 and 4, an original layout may be prepared using a layout design tool (in S121). The preparation of the original layout may include providing lower and upper metal layout patterns and via layout patterns.

The lower metal layout patterns may include first to third lower patterns M11, M12, and M13, the upper metal layout patterns may include first to third upper patterns M21, M22, and M23, and the via layout patterns may include first to third via patterns V1, V2, and V3. The first to third upper patterns M21, M22, and M23 may be provided to have a line-shaped structure extending in a first direction D1. The first to third lower patterns M11, M12, and M13 may be provided to have a line-shaped structure extending in a second direction D2 crossing the first direction D1. The second lower pattern M12 may be provided closer to the first lower pattern M11 than to the third lower pattern M13. The second upper pattern M22 may be provided closer to the first upper pattern M21 than to the third upper pattern M23.

The first via pattern V1 may be interposed between the second upper pattern M22 and the first lower pattern M11, when viewed in a sectional view, and may be overlapped with the second upper pattern M22 and the first lower pattern M11, when viewed in a plan view. The second via pattern V2 may be interposed between the third upper pattern M23 and the second lower pattern M12, when viewed in a sectional view, and may be overlapped with the third upper pattern M23 and the second lower pattern M12, when viewed in a plan view. The third via pattern V3 may be interposed between the second upper pattern M22 and the third lower pattern M13, when viewed in a sectional view, and may be overlapped with the second upper pattern M22 and the third lower pattern M13, when viewed in a plan view.

Figure 5:
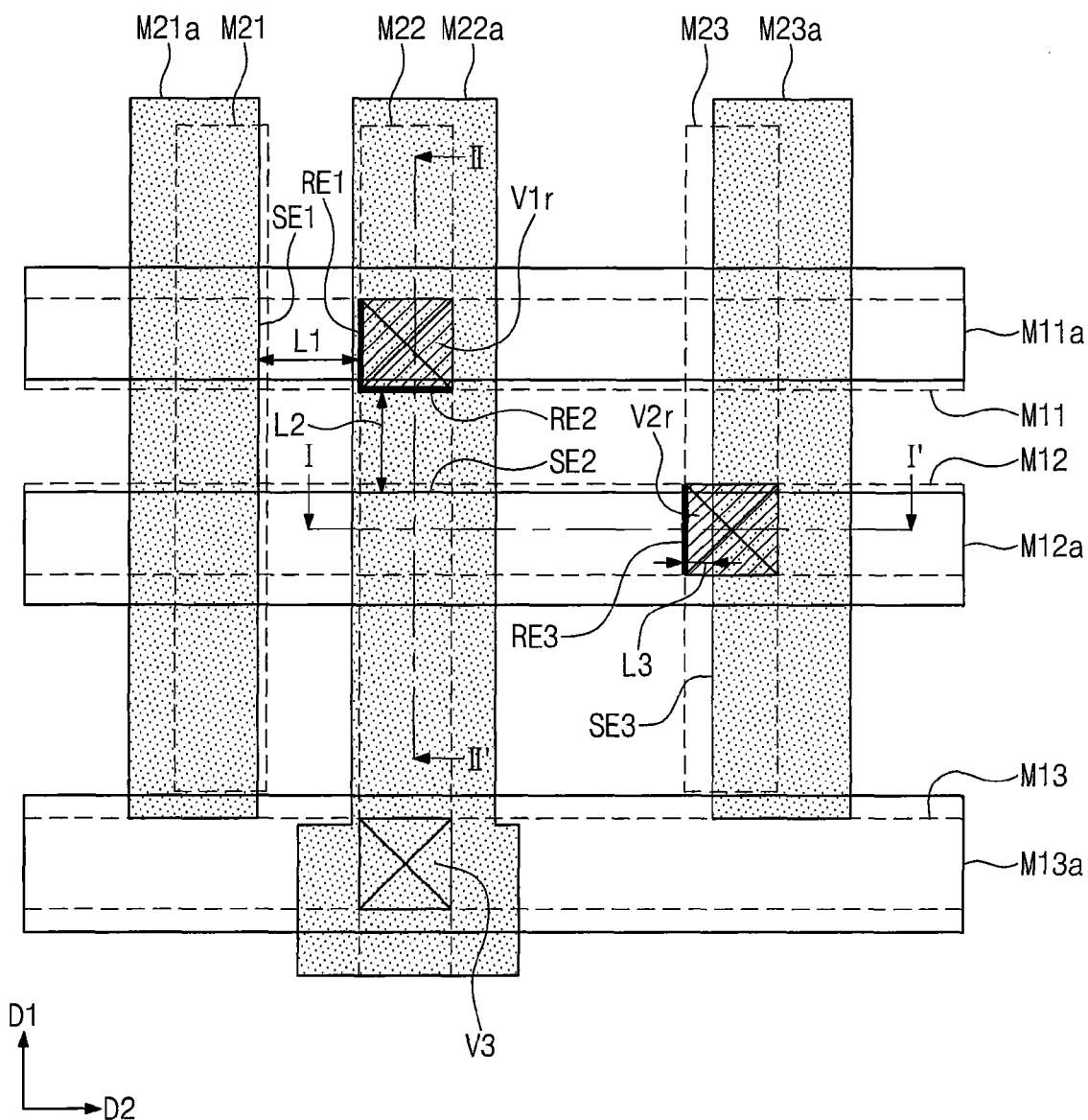

Referring to FIGS. 3 and 5, a retargeting process may be performed on the lower and upper metal layout patterns (in S122). The retargeting process may include applying a bias to the lower and upper metal layout patterns, in consideration of a process variation in a photolithography process, which may be caused by an optical proximity effect. The retargeting process may be performed using a simulation tool. In some embodiments, the retargeting process may be performed to adjust shapes and positions of the lower and upper metal layout patterns. For example, as a result of the retargeting process, the first to third lower patterns M11, M12, and M13 may be converted to first to third deformed lower patterns M11a, M12a, and M13a, and the first to third upper patterns M21, M22, and M23 may be converted to first to third deformed upper patterns M21a, M22a, and M23a.

As an example of the retargeting process in consideration of the optical proximity effect, a positive bias may be applied to a region with a low pattern density and a negative bias may be applied to a region with a high pattern density. For example, the second upper pattern M22 may include a first region, which is positioned adjacent to the third upper pattern M23 and has a low pattern density, and in this case, a positive bias may be applied to the first region so as to increase a width of the first region. By contrast, the first upper pattern M21 may include a second region, which is positioned adjacent to the second upper pattern M22 and has a high pattern density, and in this case, a negative bias may be applied to the second region so as to decrease a width of the second region.

Thereafter, risk vias may be extracted from the via patterns (in S123). As a result of the retargeting process, the shapes and positions of the lower and upper metal layout patterns may become more similar to actual shapes and positions of the lower and upper metal lines, compared with those before the retargeting process. Accordingly, the lower and upper metal layout patterns, to which the retargeting process has been applied, may be used as a reference for extracting and defining the risk vias with a high risk of process failure from the via patterns. In the present embodiment, the first and second via patterns V1 and V2 selected from the via patterns may be used as first and second risk vias V1r and V2r, respectively.

In detail, a process may be performed to detect weak edges with a high risk of process failure from edges of the first to third via patterns V1, V2, and V3. A via pattern having at least one weak edge may be defined as the risk via.

Hereinafter, a bridge risk between the upper metal lines may be referred to as a first process risk. In other words, the first process risk is a risk of an electric short circuit, which may occur between a via pattern connected to an upper metal line and other neighboring upper metal line adjacent to the upper metal line. The probability of occurrence of the first process risk may be increased when a distance between a via pattern and the neighboring upper metal line is decreased.

The first and third deformed upper patterns M21a and M23a may be adjacent to the second deformed upper pattern M22a. The first via pattern V1, which is overlapped with the second deformed upper pattern M22a, may have four edges. For the first via pattern V1, distances between the first and third deformed upper patterns M21a and M23a and edges of the first via pattern V1 adjacent thereto may be measured. Here, if the measured distance is smaller than a predetermined distance, at which the first process risk may occur, the corresponding edge may be defined as the weak edge. The predetermined distance may be a maximum edge-to-edge distance having a potential for the first process risk. If the first via pattern V1 has such a weak edge, the first via pattern V1 may be classified or extracted as the first risk via V1r.

As an example, suppose that the first risk via V1r has a first weak edge RE1 and the first deformed upper pattern M21a adjacent to the second deformed upper pattern M22a has a first edge SE1 facing the first weak edge RE1. Here, suppose that a distance between the first weak edge RE1 and the first edge SE1 is a first distance L1. The first distance L1 may be smaller than the predetermined distance, at which the first process risk is assumed to occur. In other words, the first distance L1 may be within a distance range allowing for the first process risk. If the first distance L1 is greater than the predetermined distance, the first weak edge RE1 may not be detected.

A bridge risk between the lower metal lines may be referred to as a second process risk. In other words, the second process risk is a risk of an electric short circuit, which may occur between a via pattern connected to a lower metal line and other neighboring lower metal line adjacent to the lower metal line. The probability of occurrence of the second process risk may be increased when a distance between a via pattern and the neighboring lower metal line is decreased.

The weak edge associated with the second process risk may be detected by a similar method to that of detecting the weak edge associated with the first process risk. For example, distances from edges of a via pattern to deformed lower patterns adjacent thereto may be measured. Here, if the measured distance is smaller than a predetermined distance, at which the second process risk may occur, the corresponding edge may be defined as the weak edge. The predetermined distance may be a maximum edge-to-edge distance having a potential for the second process risk. A via pattern having such a weak edge may be defined as the risk via.

As an example, suppose that the first risk via V1r has a second weak edge RE2 and the second deformed lower pattern M12a adjacent to the first deformed lower pattern M11a has a second edge SE2 facing the second weak edge RE2. Here, suppose that a distance between the second weak edge RE2 and the second edge SE2 is a second distance L2. The second distance L2 may be smaller than the predetermined distance, at which the second process risk is assumed to occur. In other words, the second distance L2 may be within a distance range allowing for the second process risk. If the second distance L2 is greater than the predetermined distance, the second weak edge RE2 may not be detected.

A disconnection risk between the lower and upper metal lines may be referred to as a third process risk. In other words, the third process risk is a risk of disconnection between the upper and lower metal lines, which may occur when a via pattern downward extending from the upper metal line does not reach the lower metal line. For example, the third process risk may occur when a via hole is formed not to expose a desired region of the lower metal line.

The detection of the weak edge associated with the third process risk may include measuring edge-to-edge distances from a via pattern to the deformed upper pattern overlapped with the via pattern. Here, if the edge-to-edge distance is smaller than a predetermined distance, at which the third process risk may occur, or has a negative value, the corresponding edge of a via pattern may be defined as the weak edge. The predetermined distance may be a maximum edge-to-edge distance having a potential for the third process risk. A via pattern having such a weak edge may be defined as the risk via. In the case where a portion including the weak edge of the risk via protrudes from the deformed upper pattern, a distance between the weak edge and the deformed upper pattern may have a negative value.

As an example, suppose that the second risk via V2r has a third weak edge RE3 and the third deformed upper pattern M23a overlapped with the second risk via V2r has a third edge SE3 facing the third weak edge RE3. In certain cases, the second risk via V2r with the third weak edge RE3 may have a portion protruding from the third edge SE3. In this case, a distance (i.e., a third distance L3) between the third weak edge RE3 and the third edge SE3 may have a negative value. In other words, the third distance L3 may be within a distance range allowing for the third process risk. If the third distance L3 is a positive value and is larger than a predetermined distance, at which the third process risk may occur, the third weak edge RE3 may not be detected.

The third via pattern V3 of the via patterns may be provided to be free from the first to third process risks. For example, four edges of the third via pattern V3 may be positioned spaced apart from the first and third deformed upper patterns M21a and M23a adjacent to the second deformed upper pattern M22a by a distance greater than the predetermined distance associated with the first process risk. Furthermore, the four edges of the third via pattern V3 may be positioned spaced apart from the second deformed lower pattern M12a adjacent to the third deformed lower pattern M13a by a distance greater than the predetermined distance associated with the second process risk. The four edges of the third via pattern V3 may be positioned spaced apart from edges of the second deformed upper pattern M22a by a distance greater than the predetermined distance associated with the third process risk. In this case, the third via pattern V3 may not be classified as the risk via.

The first to third process risks will be described in more detail below.

Figure 6:
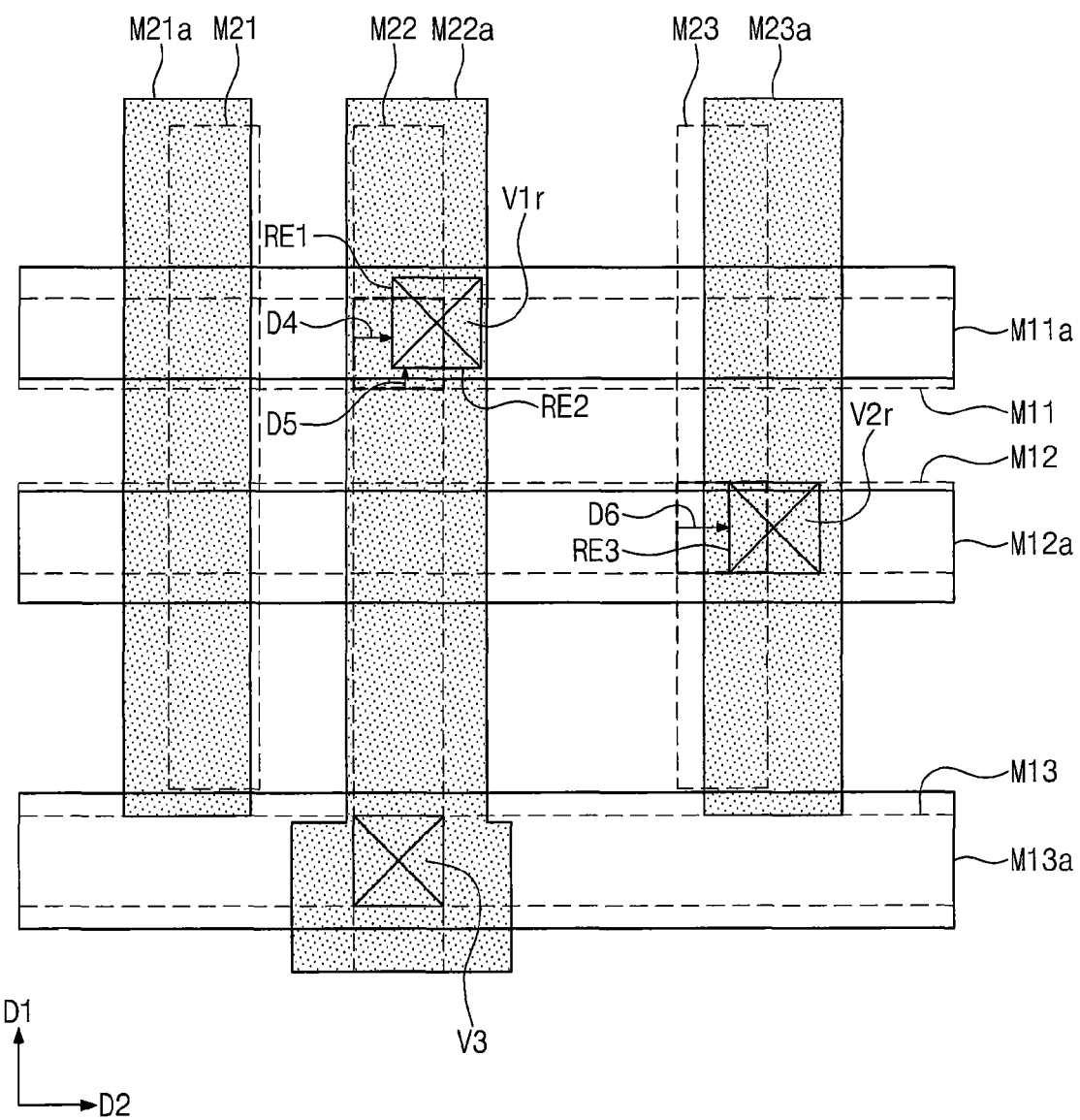

Referring to FIGS. 3 and 6, a position correction process may be performed to change positions of the risk vias of the lower and upper metal layout patterns (in S124). For example, the first risk via V1r may be moved in a fourth direction D4 and a fifth direction D5. The second risk via V2r may be moved in a sixth direction D6. Since the third via pattern V3 is free from the process risk, the position of the third via pattern V3 may not be changed during the position correction process.

Here, the fourth direction D4 may be a direction that is oriented toward a center of the first risk via V1r and is not parallel to the first weak edge RE1. By moving the first risk via V1r in a direction perpendicular to the first weak edge RE1, it is possible to overcome the first process risk associated with the first weak edge RE1. The fifth direction D5 may be a direction that is not parallel to the second weak edge RE2 and is oriented toward a center of the first risk via V1r. By moving the first risk via V1r in a direction perpendicular to the second weak edge RE2, it is possible to overcome the second process risk associated with the second weak edge RE2. The sixth direction D6 may be a direction that is not parallel to the third weak edge RE3 and is oriented toward a center of the second risk via V2r. By moving the first risk via V1r in a direction perpendicular to the third weak edge RE3, it is possible to overcome the third process risk associated with the third weak edge RE3.

Accordingly, various embodiments that were illustrated in FIGS. 1-6 illustrate a method of designing a layout of a semiconductor device (FIGS. 2 and 3) that comprises first and second metal patterns and a via pattern therebetween that comprises vias (FIG. 4), the method comprising changing a position of a subset of the vias in the via pattern, relative to remaining vias in the via pattern, based on a process risk factor, the subset including at least one, but less than all, of the vias in the via pattern (FIGS. 5 and 6). As was also illustrated in FIG. 5, in some embodiments the process risk factor comprises a distance between an edge of a via in the via pattern and an edge of the first and/or second metal pattern that overlaps the via in the via pattern being less than a threshold. As was also illustrated in FIG. 5, the method may further comprise forming a pseudo contour from the first and second metal patterns based on an etch skew, wherein the process risk factor is based on the pseudo contour. As was illustrated in FIG. 6, the changing comprises moving the position of a respective risk via toward a center of the respective risk via. Finally, as was illustrated in FIG. 2, the method may further comprise manufacturing a photomask using the layout including the position of a subset of the vias in the via pattern that was changed and fabricating the semiconductor device from the photomask.

According to the afore-described layout design process, it is possible to reduce or minimize the number of the via layout patterns, to which the position correction process should be applied, and thereby to reduce a change in electric characteristics of the semiconductor device which may occur when the layout is changed. Furthermore, it is possible to quickly and efficiently correct the layout for the semiconductor device, with a lowered process risk.

Figure 7:
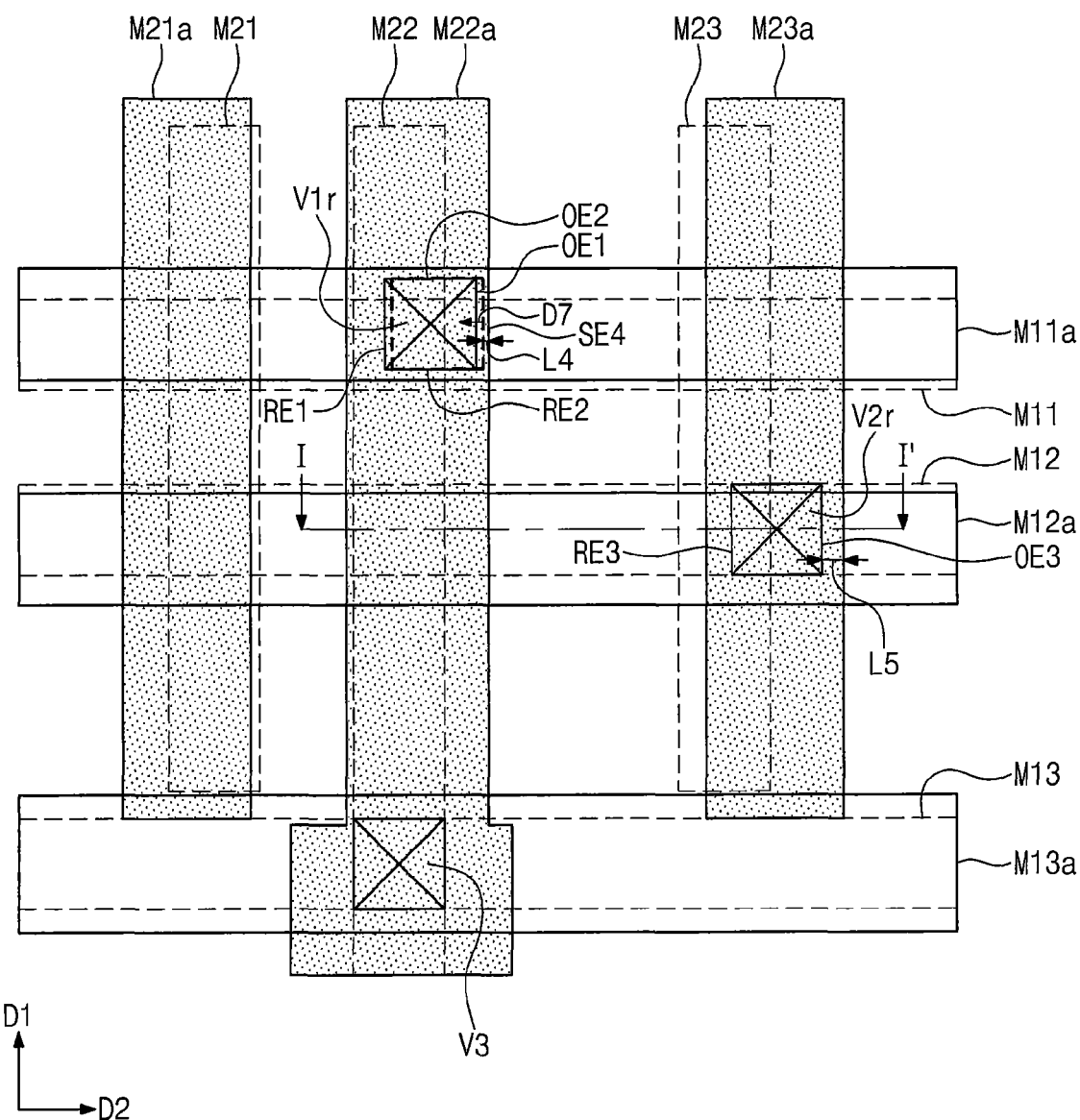

Referring to FIGS. 3 and 7, a design-rule check (DRC) may be performed on the corrected layout (in S125). Here, the DRC may be performed to examine whether there is an additional process risk in the risk vias, on which the position correction process has been performed.

For example, the DRC may be performed to examine whether there is an additional process risk in the first to third opposite edges OE1, OE2, and OE3, which are positioned to face the first to third weak edges RE1, RE2, and RE3, respectively. Here, the first risk via V1r may include the first and second opposite edges OE1 and OE2 and the second risk via V2r may include the third opposite edge OE3.

The first opposite edge OE1 may be positioned in such a way to have the third process risk with respect to the second deformed upper pattern M22a overlapped with the first risk via V1r. For example, the first opposite edge OE1 may be spaced apart from a fourth edge SE4 of the second deformed upper pattern M22a by a fourth distance L4 smaller than the predetermined distance associated with the third process risk. By contrast, the second and third opposite edges OE2 and OE3 may be free from an additional process risk.

In the case where the first risk via V1r has the first opposite edge OE1 expected to have a process risk, the position correction process may be again performed on the first risk via V1r (in S124). For example, the first risk via V1r may be moved in a seventh direction D7. The seventh direction D7 may be a direction that is not parallel to the first opposite edge OE1 and is oriented toward the center of the first risk via V1r. Such a movement may make it possible to prevent the third process risk from occurring in the first risk via V1r. Since there is no additional process risk in the second risk via V2r, the position of the second risk via V2r may not be changed during the position correction process on the first risk via V1r.

Thereafter, the DRC may be again performed on the layout corrected (in S125). For example, the DRC may be performed to examine whether there is an additional process risk in the first risk via V1r, on which the position correction process has been again performed. If there is no process risk, the corrected layout data (e.g., the corrected data for via patterns) may be output (in S126).

FIGS. 8A through 8D are sectional views taken along line I-I' of FIG. 5, to illustrate a process of fabricating a semiconductor device according to example embodiments of the inventive concepts. In detail, FIGS. 8A through 8D illustrate an example of the third process risk, which may occur when the layout described with reference to FIG. 5 is used to fabricate a semiconductor device.

Figure 8A:
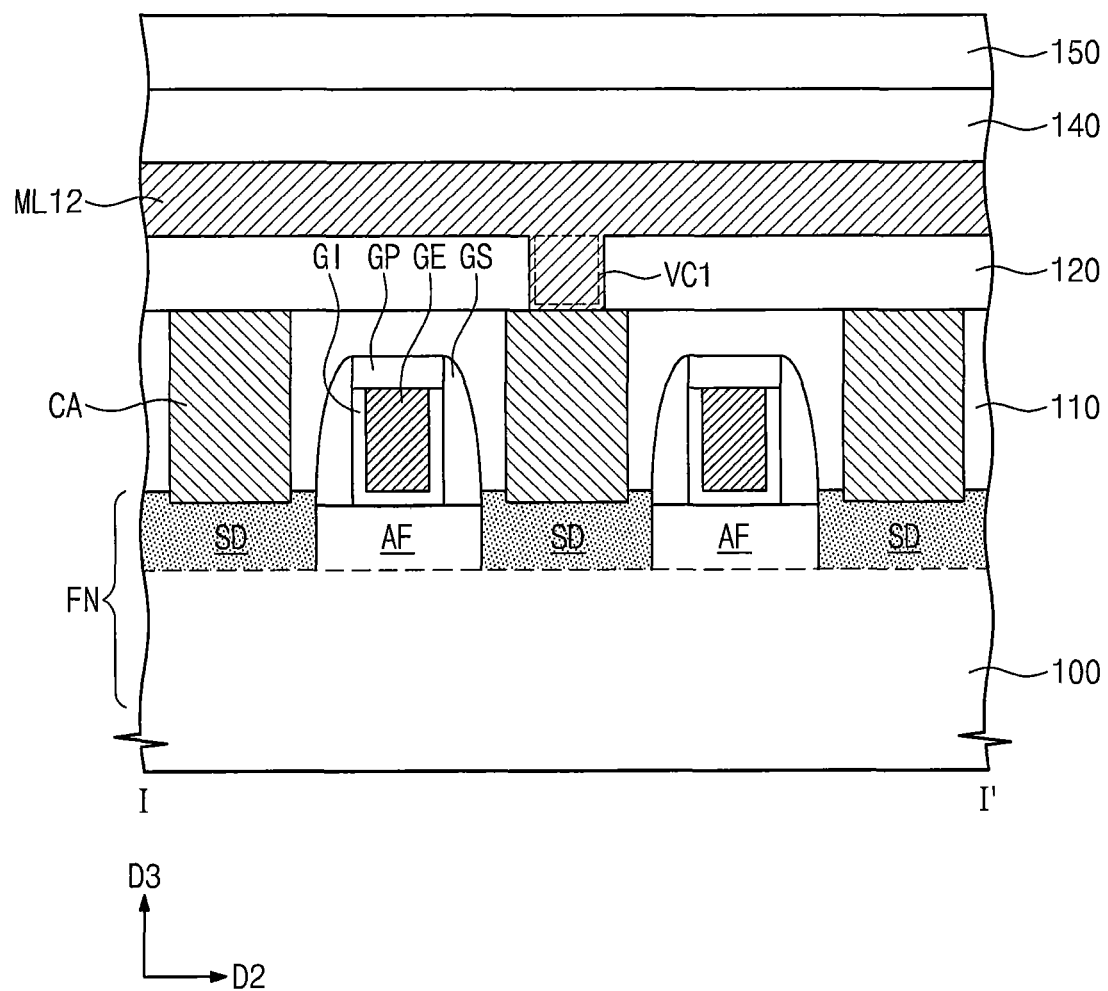
FIGS. 8A through 8D are sectional views taken along line I-I' of FIG. 5, to illustrate a process of fabricating a semiconductor device according to example embodiments of the inventive concepts.

Referring to FIGS. 5 and 8A, a substrate 100 may be provided. In some embodiments, the substrate 100 may be a silicon substrate, a germanium substrate, a silicon-on-insulator (SOI) substrate, a compound semiconductor substrate and/or a non-semiconductor substrate.

An active pattern FN may be provided in a top portion of the substrate 100. Gate electrodes GE may be provided on the active pattern FN to cross the active pattern FN and extend in the first direction D1. The gate electrodes GE may be arranged spaced apart from each other in the second direction D2.

A gate insulating pattern GI may be provided below each of the gate electrodes GE, and gate spacers GS may be provided on both sidewalls of each of the gate electrodes GE. In addition, a capping pattern GP may be provided on a top surface of each of the gate electrodes GE. First to fifth interlayer insulating layers 110-150 may be provided to cover the gate electrodes GE.

The gate electrodes GE may be formed of or include doped semiconductors, metals and/or conductive metal nitrides. The gate insulating pattern GI may include a silicon oxide layer, a silicon oxynitride layer and/or a high-k dielectric layer whose dielectric constant is higher than that of a silicon oxide layer. Each of the capping pattern GP and the gate spacers GS may be formed of or include a silicon oxide layer, a silicon nitride layer and/or a silicon oxynitride layer. Each of the first to fifth interlayer insulating layers 110-150 may be formed of or include a silicon oxide layer and/or a silicon oxynitride layer.

Source/drain regions SD may be provided in portions of the active patterns FN positioned at both sides of each of the gate electrodes GE. The source/drain regions SD may be p- or n-type impurity regions.

The source/drain regions SD may be epitaxial patterns formed by a selective epitaxial growth process. The source/drain regions SD may include a semiconductor element different from those of the substrate 100. As an example, the source/drain regions SD may be formed of or include a semiconductor material having a lattice constant different from (greater or smaller than) the substrate 100. Accordingly, the source/drain regions SD may exert a compressive stress or a tensile stress on channel regions AF between the source/drain regions SD. As an example, in the case where the substrate 100 is a silicon wafer, the source/drain regions SD of a PMOSFET region PR may be formed of or include a silicon-germanium (e-SiGe) and/or germanium layer. In this case, the source/drain regions SD may exert a compressive stress on the channel regions AF. As another example, in the case where the substrate 100 is a silicon wafer, the source/drain regions SD of an NMOSFET region NR may be formed of or include silicon carbide (SiC). In this case, the source/drain regions SD may exert a tensile stress on the channel regions AF. The compressive or tensile stress exerting on the channel regions AF may make it possible to increase mobility of carriers in the channel regions AF, when the transistors are operated.

Source/drain contacts CA may be provided between the gate electrodes GE. The source/drain contacts CA may be arranged along the active pattern FN and in the second direction D2. The source/drain contacts CA may be directly coupled to and electrically connected to the source/drain regions SD. The source/drain contacts CA may be provided in the first interlayer insulating layer 110.

A first via contact VC1 may be provided in the second interlayer insulating layer 120 that is stacked on the first interlayer insulating layer 110. A second lower metal line ML12 may be provided in the third interlayer insulating layer 130 that is stacked on the second interlayer insulating layer 120. The second lower metal line ML12 may serve as or correspond to the second deformed lower pattern M12a previously described with reference to FIG. 5. The second lower metal line ML12 may be electrically connected to the source/drain contact CA via the first via contact VC1.

Figure 8B:
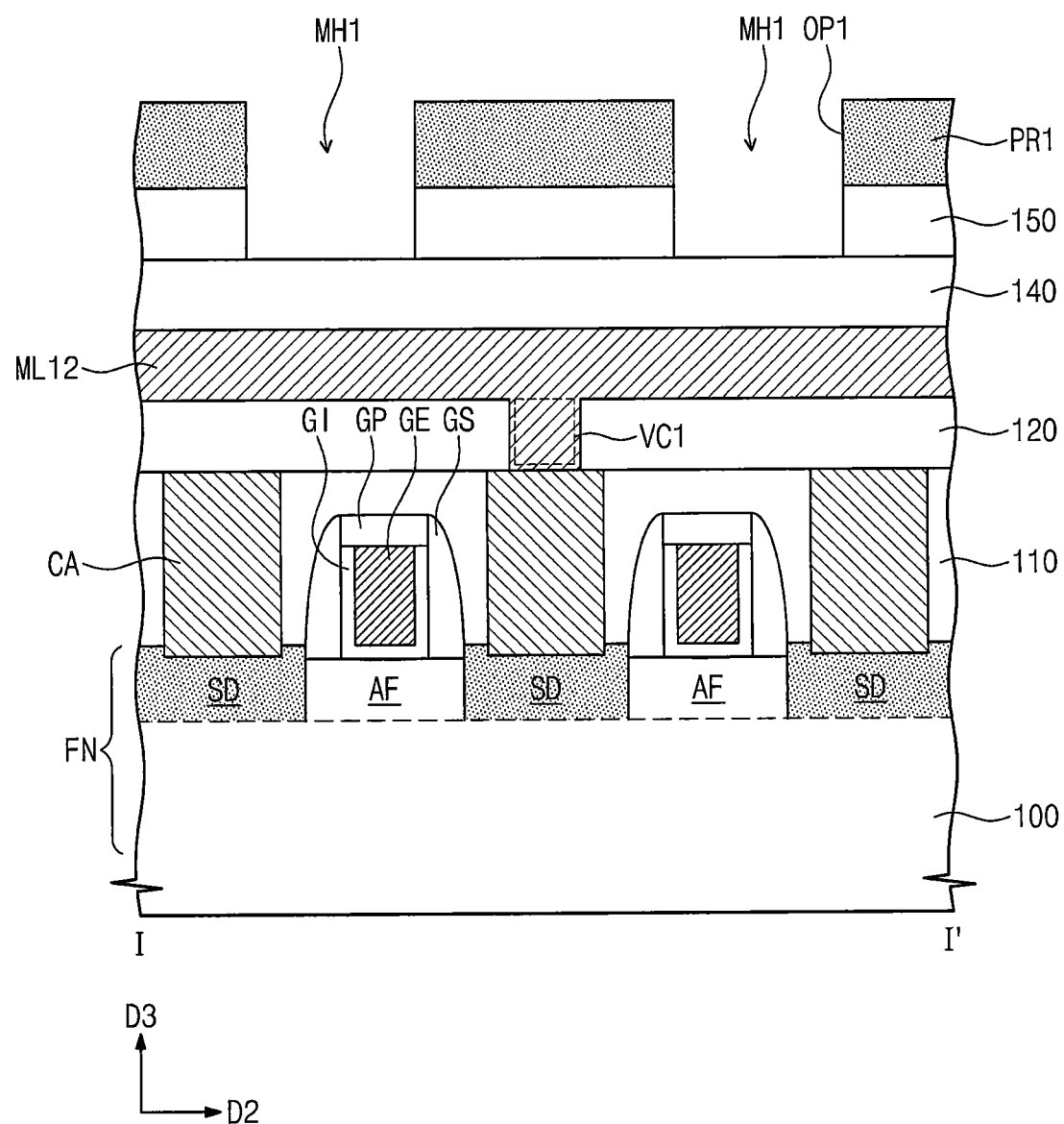

Referring to FIGS. 5 and 8B, a first photomask may be used to form first photoresist patterns PR1 on the fifth interlayer insulating layer 150. The first photomask may be manufactured, based on the upper metal layout patterns previously described with reference to FIG. 5. The first photoresist patterns PR1 may be formed to have first openings OP1 defining the upper metal lines. Thereafter, the fifth interlayer insulating layer 150 may be etched using the first photoresist patterns PR1 as an etch mask to form first metal line holes MH1.

Figure 8C:
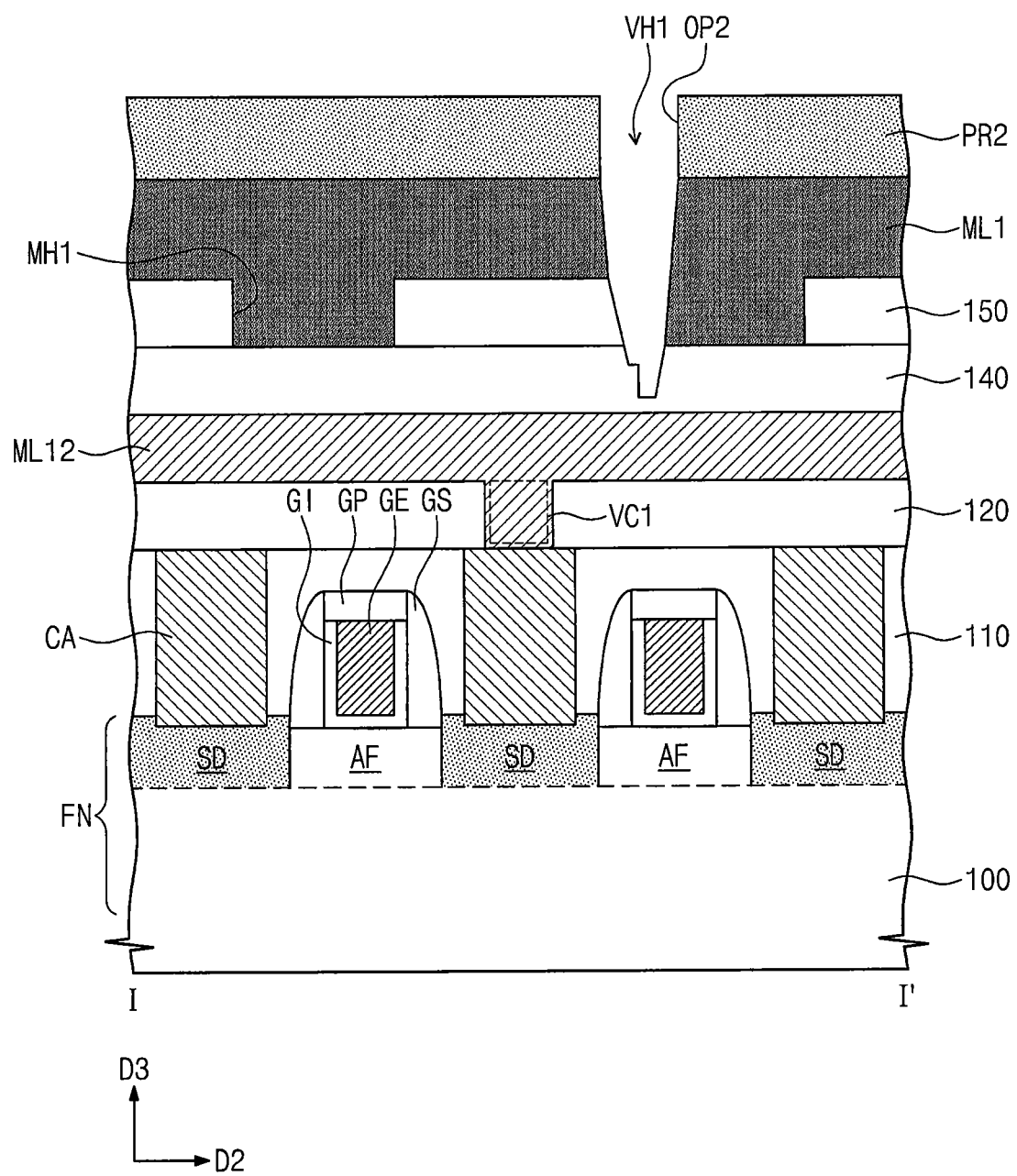

Referring to FIGS. 5 and 8C, the first photoresist patterns PR1 may be removed. Thereafter, a first mask layer ML1 may be formed to fill the first metal line holes MH1. A second photomask may be used to form second photoresist patterns PR2 on the first mask layer ML1. The second photomask may be manufactured, based on the via layout patterns previously described with reference to FIG. 5. The second photoresist patterns may be formed to have a second opening OP2 defining the via contact. For example, the second opening OP2 may correspond to the second risk via V2r.

A portion of the second opening OP2 may not be overlapped with the first metal line holes MH1, when viewed in a plan view. For example, referring back to FIG. 5, the second risk via V2r may have a portion laterally protruding from third deformed upper pattern M23a. Accordingly, the second opening OP2 may not be overlapped with the entire area of the first metal line hole MH1; that is, the second opening OP2 may be offset from the first metal line hole MH1.

The first mask layer ML1 and the fourth interlayer insulating layer 140 may be etched using the second photoresist patterns PR2 as an etch mask to form a first via hole VH1. The offset of the second opening OP2 from the first metal line hole MH1 may lead to a reduction in a top area of the fourth interlayer insulating layer 140 exposed by the second opening OP2. Furthermore, the first via hole VH1 may be formed not to completely penetrate the fourth interlayer insulating layer 140. For example, the second lower metal line ML12 may not be exposed by the first via hole VH1.

Figure 8D:
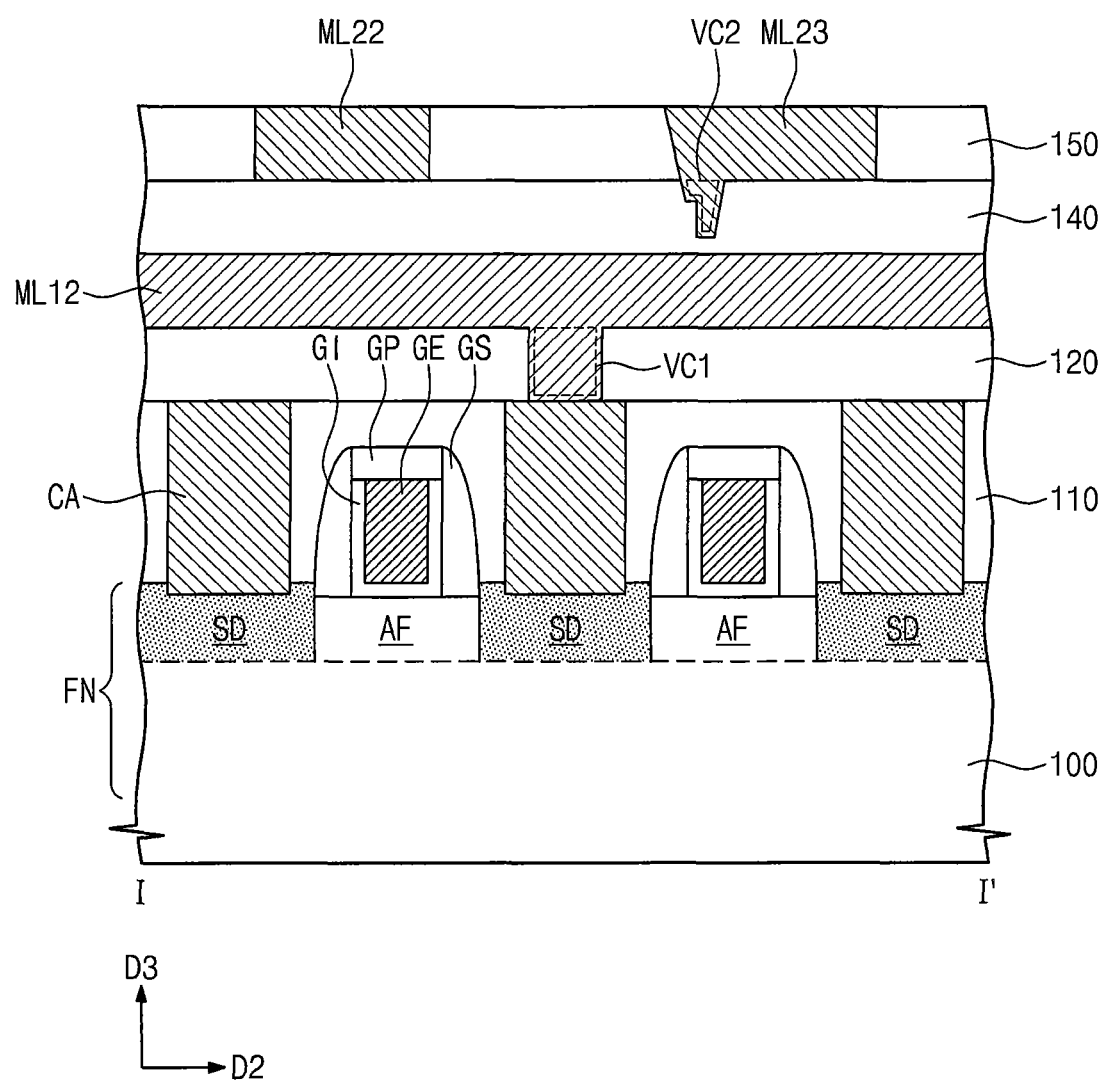

Referring to FIGS. 5 and 8D, the first mask layer ML1 and the second photoresist patterns PR2 may be removed. The first metal line holes MH1 and the first via hole VH1 may be filled with a conductive material. As a result, a second upper metal line ML22, a third upper metal line ML23, and a second via contact VC2 may be formed. The second upper metal line ML22 and the third upper metal line ML23 may correspond to the second and third deformed upper patterns M22a and M23a, respectively, of FIG. 5. The second via contact VC2 may correspond to the second risk via V2r described with reference to FIG. 5.

The second via contact VC2 may be formed not to be in contact with the second lower metal line ML12. Accordingly, the third upper metal line ML23 may be electrically disconnected from the second lower metal line ML12. That is, in the case where the position of the second risk via V2r is not corrected, the third process risk may occur.

Figure 9A:
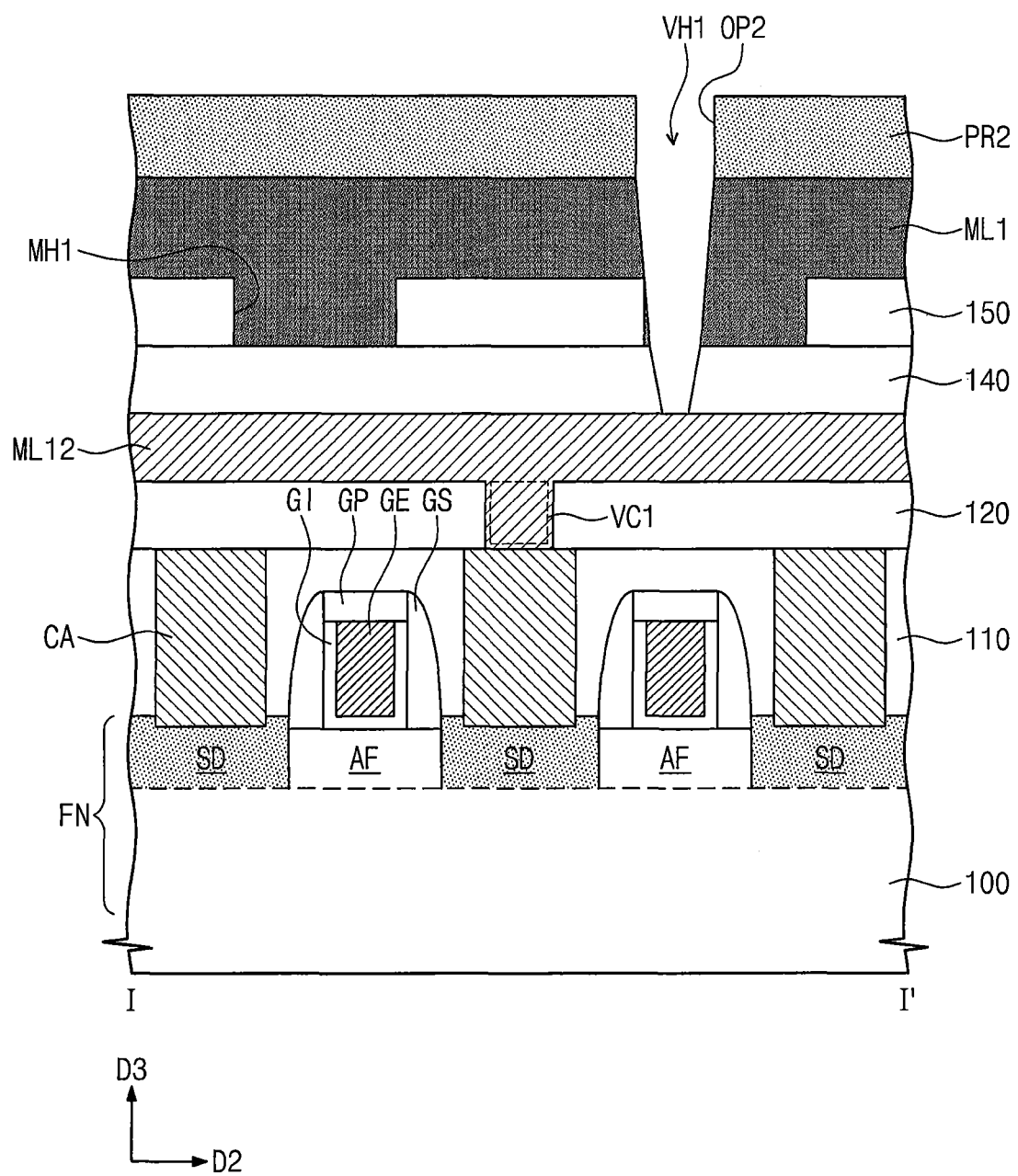
FIGS. 9A and 9B are sectional views taken along line I-I' of FIG. 7, to illustrate a process of fabricating a semiconductor device according to other example embodiments of the inventive concepts.
Figure 9B:
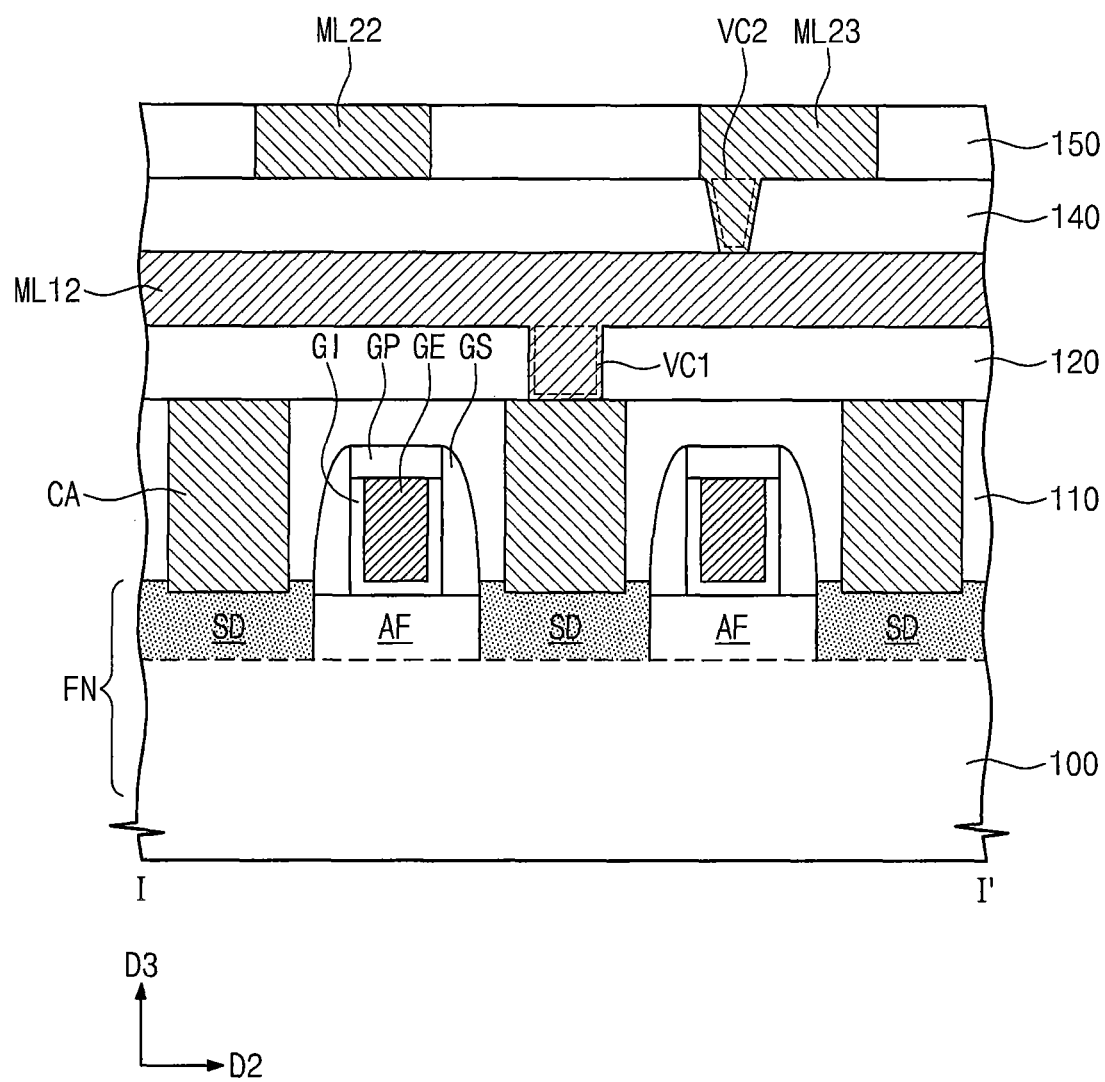

FIGS. 9A and 9B are sectional views taken along line I-I' of FIG. 7, to illustrate a process of fabricating a semiconductor device according to other example embodiments of the inventive concepts. In detail, FIGS. 9A and 9B show an example in which a semiconductor device is fabricated without the third process risk, based on the layout described with reference to FIG. 7. For concise description, elements previously described with reference to FIG. 5 and FIGS. 8A through 8D may be identified by a similar or identical reference number without repeating an overlapping description thereof.

Referring to FIGS. 7 and 9A, a first photomask may be manufactured, based on the upper metal layout patterns described with reference to FIG. 7. The first photomask may be used to form first metal line holes MH1 penetrating the fifth interlayer insulating layer 150.

Thereafter, a first mask layer ML1 may be formed to fill the first metal line holes MH1. A second photomask may be used to form second photoresist patterns PR2 on the first mask layer ML1. The second photomask may be manufactured, based on the via layout patterns of FIG. 7 (i.e., to which the position correction process has been applied). The second photoresist patterns may be formed to have a second opening OP2 defining the via contact. For example, the second opening OP2 may correspond to the second risk via V2$r$ to which the position correction process has been applied.

The second opening OP2 may be overlapped with the first metal line hole MH1, when viewed in a plan view. Referring back to FIG. 7, the position of the second risk via V2$r$ may be corrected to allow for the second risk via V2$r$ to be positioned within the third deformed upper pattern M23$a$, unlike that shown in FIG. 5. Accordingly, the second opening OP2 may be formed to be completely overlapped with the first metal line hole MH1.

The first mask layer ML1 and the fourth interlayer insulating layer 140 may be etched using the second photoresist patterns PR2 as an etch mask to form a first via hole VH1. The first via hole VH1 may be formed to completely penetrate the fourth interlayer insulating layer 140. Accordingly, the second lower metal line ML12 may be exposed by the first via hole VH1.

Referring to FIGS. 7 and 9B, the first mask layer ML1 and the second photoresist patterns PR2 may be removed. The first metal line holes MH1 and the first via hole VH1 may be filled with a conductive material. As a result, a second upper metal line ML22, a third upper metal line ML23, and a second via contact VC2 may be formed. The second via contact VC2 may be in contact with the second lower metal line ML12. Accordingly, the third upper metal line ML23 and the second lower metal line ML12 may be connected to each other without disconnection. This means that the third process risk can be effectively prevented by the layout design method (i.e., including the position correction process on the via layout patterns) of FIGS. 3 through 7.

Figure 10:
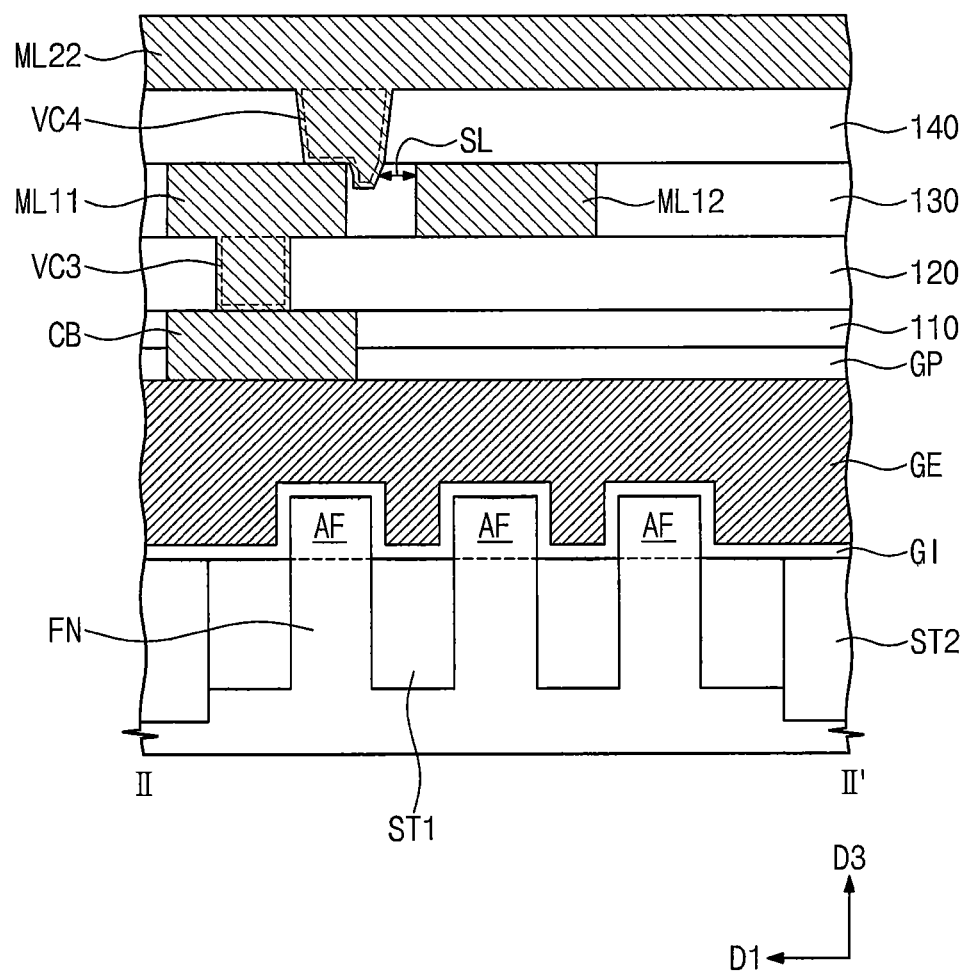
FIG. 10 is a sectional view taken along line II-II' of FIG. 5 to illustrate a semiconductor device according to example embodiments of the inventive concepts.

FIG. 10 is a sectional view taken along line II-II' of FIG. 5 to illustrate a semiconductor device according to example embodiments of the inventive concepts. In detail, FIG. 10 shows an example of the second process risk, which may occur when the layout described with reference to FIG. 5 is used to fabricate a semiconductor device. For concise description, elements previously described with reference to FIG. 5 and FIGS. 8A through 8D may be identified by a similar or identical reference number without repeating an overlapping description thereof.

Referring to FIGS. 5 and 10, first device isolation layers ST1 may be provided in an upper portion of the substrate 100 to define the active patterns FN. The substrate 100 may include a PMOSFET region and/or a NMOSFET region, and the active patterns FN shown in FIG. 10 may be provided on the PMOSFET or NMOSFET region. Although not shown, the PMOSFET and NMOSFET regions may be provided adjacent to each other in the first direction D1 and may be spaced apart from each other with second device isolation layers ST2 interposed therebetween.

The active patterns FN may be arranged along the first direction D1. The first device isolation layers ST1 may be provided at both sides of each of the active patterns FN to extend in the second direction D2. In example embodiments, each of the active patterns FN may include a fin-shaped portion positioned at an upper level thereof. As an example, the fin-shaped portion may protrude in an upward direction between the first device isolation layers ST1.

The first device isolation layer ST1 may be connected to the second device isolation layers ST2 to form a single continuous insulating layer. In certain embodiments, the second device isolation layers ST2 may have a thickness greater than that of the first device isolation layers ST1. In this case, the first device isolation layers ST1 may be formed by a process different from that for the second device isolation layers ST2. In other embodiments, the first device isolation layers ST1 may be formed by the same process as that for the second device isolation layers ST2, thereby having substantially the same thickness as that of the second device isolation layers ST2. The first and second device isolation layers ST1 and ST2 may be formed of or include a silicon oxide layer.

The gate electrode GE may be provided on the active patterns FN to cross the active patterns FN and extend parallel to the first direction D1. The fin portions, which are positioned below and overlapped with the gate electrode GE, may serve as the channel regions AF of the transistors.

A gate contact CB may be provided on the gate electrode GE to penetrate the first interlayer insulating layer 110 and the capping pattern GP. A third via contact VC3 may be provided in the second interlayer insulating layer 120 stacked on the first interlayer insulating layer 110. First and second lower metal lines ML11 and ML12 may be provided in the third interlayer insulating layer 130 stacked on the second interlayer insulating layer 120. The first and second lower metal lines ML11 and ML12 may correspond to the first and second deformed lower patterns M11$a$ and M12$a$, respectively, which have been described with reference to FIG. 5. The first lower metal line ML11 may be electrically connected to the gate electrode GE via the third via contact VC3 and the gate contact CB.

A fourth via contact VC4 may be provided through the fourth interlayer insulating layer 140 to be in contact with the first lower metal line ML11. The fourth via contact VC4 may be formed using a third photomask. The third photomask may be manufactured, based on the via layout patterns described with reference to FIG. 5. Accordingly, the fourth via contact VC4 may correspond to the first risk via V1$r$. The second upper metal line ML22 may be provided in the fifth interlayer insulating layer 150 on the fourth interlayer insulating layer 140. The second upper metal line ML22 may correspond to the second deformed upper pattern M22$a$ described with reference to FIG. 5. The second upper metal line ML22 may be electrically connected to the first lower metal line ML11 via the fourth via contact VC4.

Meanwhile, referring back to FIG. 5, the first risk via V1$r$ may be spaced apart from the second deformed lower pattern M12$a$ adjacent to the first deformed lower pattern M11$a$ by the second distance L2. As described above, the second distance L2 may be a distance, at which the second process risk starts to occur. Accordingly, the fourth via contact VC4 may not be completely overlapped with the first lower metal line ML11 and may be offset from the first lower metal line ML11, when viewed in a plan view. As a result, the fourth via contact VC4 may be positioned very close to the second lower metal line ML12. The fourth via contact VC4 and the second lower metal line ML12 may be spaced apart from each other by a separation distance SL, at which an electric short between the fourth via contact VC4 and the second lower metal line ML12 (or the second process risk) may occur.

Figure 11:
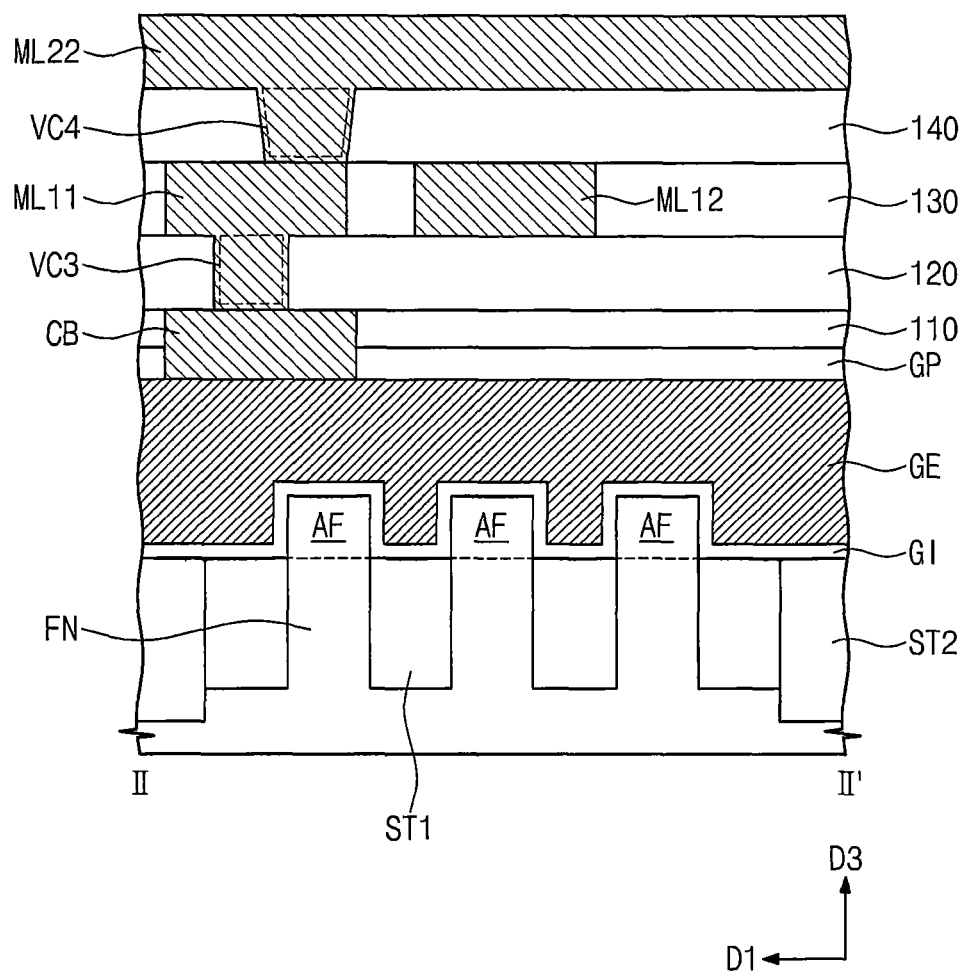
FIG. 11 is a sectional view taken along line II-II' of FIG. 7 to illustrate a semiconductor device according to other example embodiments of the inventive concepts.

FIG. 11 is a sectional view taken along line II-II' of FIG. 7 to illustrate a semiconductor device according to other example embodiments of the inventive concepts. In detail, FIG. 11 shows an example in which a semiconductor device is fabricated without the second process risk, based on the layout described with reference to FIG. 7. For concise description, elements previously described with reference to FIGS. 5 and 10 may be identified by a similar or identical reference number without repeating an overlapping description thereof.

Referring to FIGS. 7 and 11, the fourth via contact VC4 may be formed on the basis of the via layout patterns, to which the position correction process has been applied. The fourth via contact VC4 may be interposed between the second upper metal line ML22 and the first lower metal line ML11. Referring back to FIG. 7, the position of the first risk via V1r may be corrected to allow for the first risk via V1r to be spaced apart from the second deformed lower pattern M12a by a sufficient distance, unlike that shown in FIG. 5. Accordingly, unlike that shown in FIG. 10, the fourth via contact VC4 may be sufficiently spaced apart from the second lower metal line ML12. As a result, it is possible to reduce or prevent an electric short circuit from being formed between the fourth via contact VC4 and the second lower metal line ML12.

Figure 12:
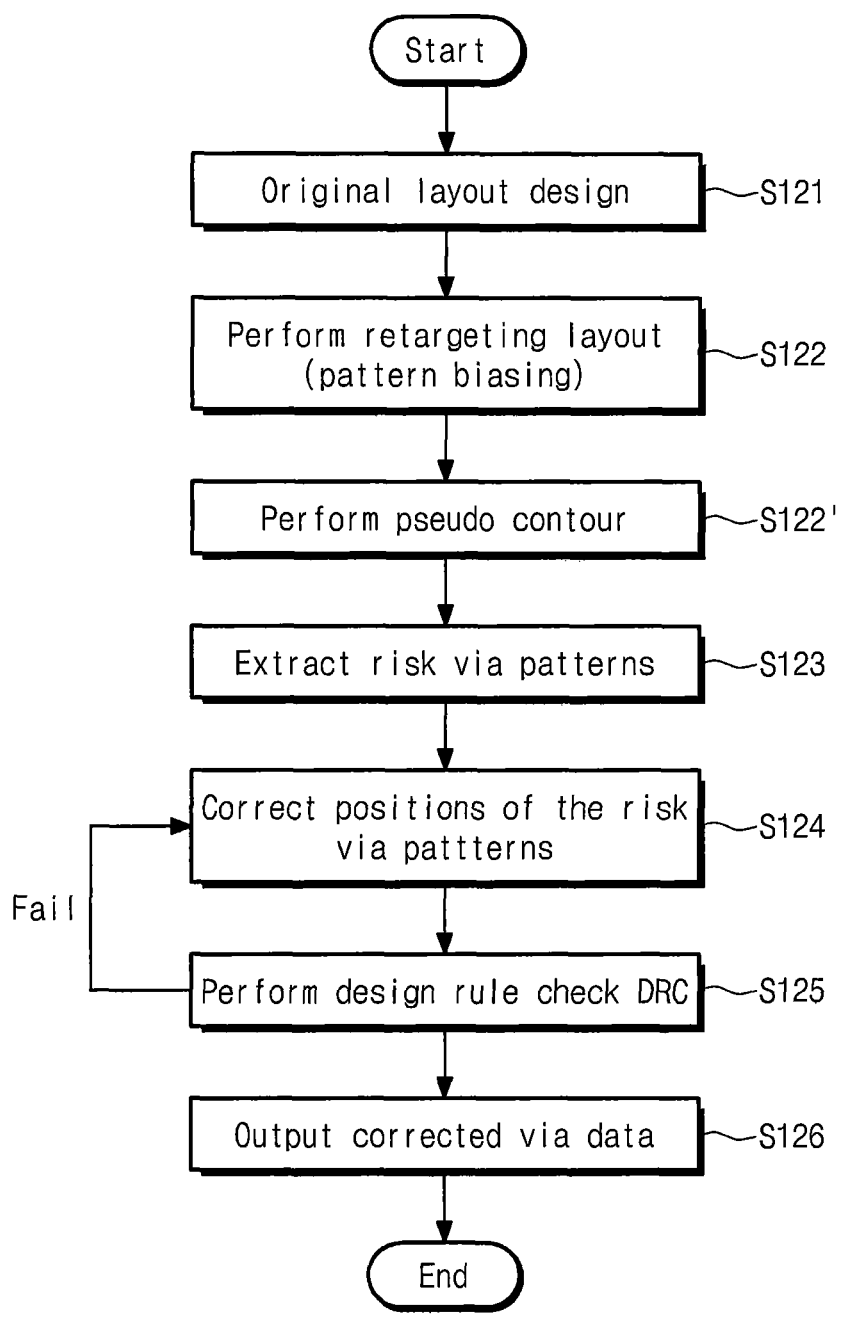
FIG. 12 is a flow chart illustrating a layout design of FIG. 2, according to other example embodiments of the inventive concepts.
Figure 13:
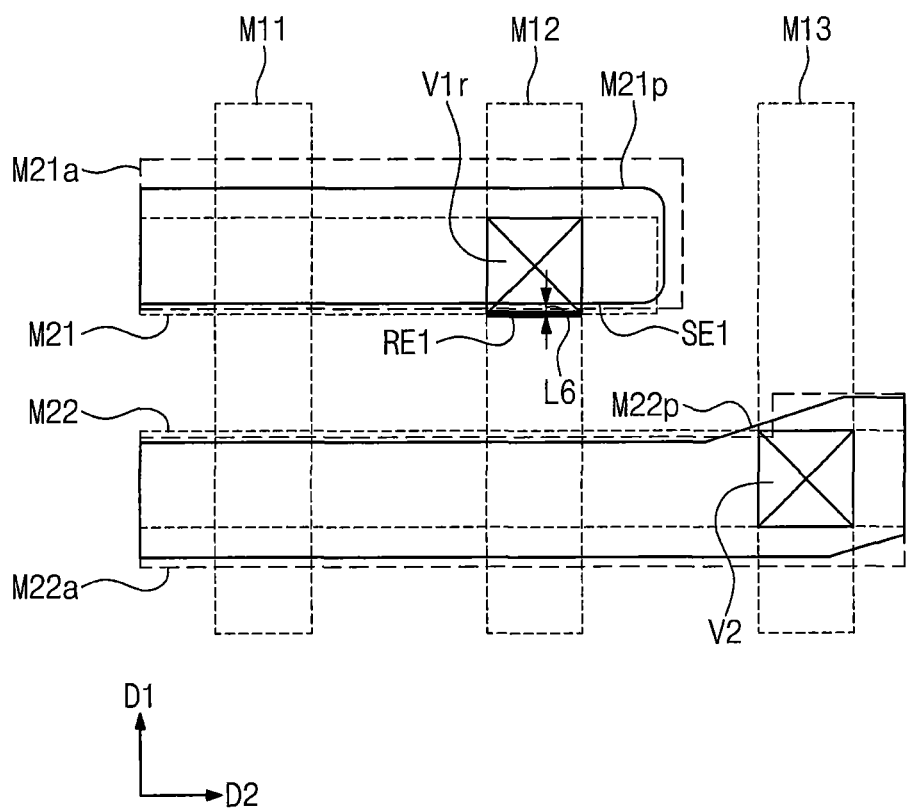
FIGS. 13 and 14 are plan views illustrating a method of correcting positions of via patterns, which are presented as an example of layout patterns for describing a method of designing a metal layout according to other example embodiments of the inventive concepts.
Figure 14:
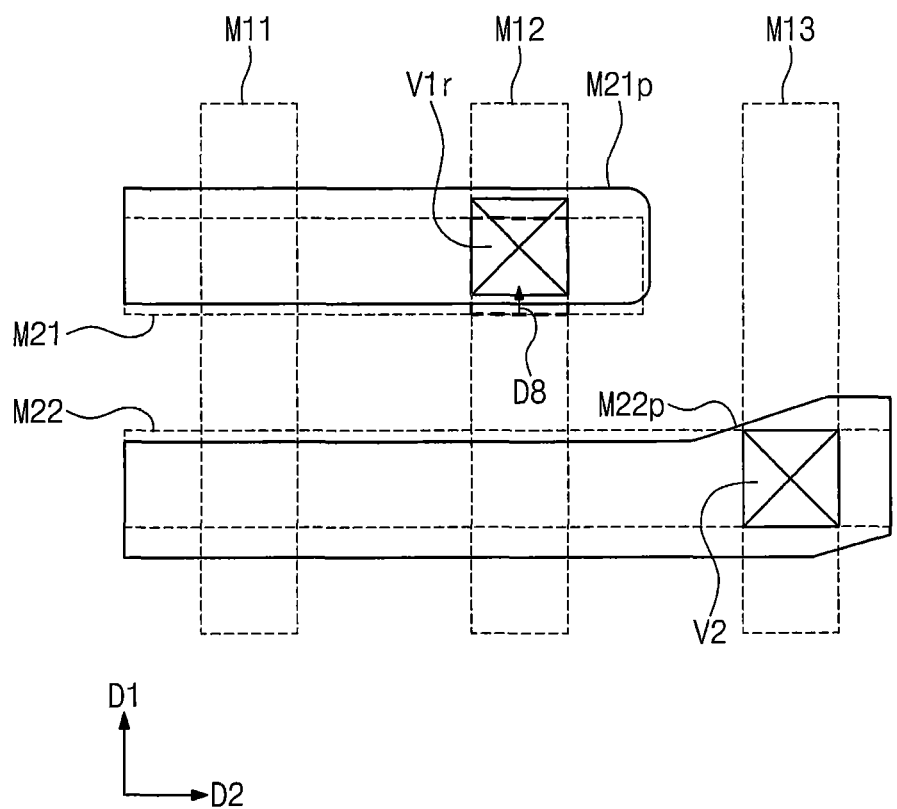

FIG. 12 is a flow chart illustrating a layout design step of FIG. 2, according to other example embodiments of the inventive concepts. FIGS. 13 and 14 are plan views illustrating a method of correcting positions of via patterns, which are presented as an example of layout patterns for describing a method of designing a metal layout according to other example embodiments of the inventive concepts. For example, FIGS. 13 and 14 may illustrate layouts for realizing a first and second metal layers sequentially formed on a semiconductor substrate and vias interposed therebetween. For concise description, elements previously described with reference to FIGS. 3 through 7 may be identified by a similar or identical reference number without repeating an overlapping description thereof.

Referring to FIGS. 12 and 13, lower and upper metal layout patterns and via layout patterns may be provided. The lower metal layout patterns may include the first to third lower patterns M11, M12, and M13, each of which is a line-shaped structure extending in the first direction D1. The upper metal layout patterns may include the first and second upper patterns M21 and M22, each of which is a line-shaped structure extending in the second direction D2 crossing the first direction D1.

A retargeting process may be performed on the upper metal layout patterns (in S122). As a result of the retargeting process, the first and second upper patterns M21 and M22 may be converted to the first and second deformed upper patterns M21a and M22a. Thereafter, a pseudo-contour formation process may be performed on the upper metal layout patterns, on which the retargeting process has been performed (in S122'). As a result, the first and second deformed upper patterns M21a and M22a may be converted to first and second pseudo contour patterns M21p and M22p.

The retargeting process may be effective in correcting a photolithographic process error, which may be caused by an optical proximity effect in a photolithography process, but may have a difficulty in correcting an etching process error (e.g., the etch skew error), which may occur in an etching process after the photolithography process. In this sense, on layout patterns, on which the retargeting process has been performed, the pseudo-contour formation process may be performed using a simulation tool, under the condition established in consideration of the 2D proximity and etch skew effects. In certain embodiments, corner rounding and line-end shortening may be typical examples of the 2D proximity effects. The pseudo-contour formation process may be more quickly performed than a simulation process under several process conditions established in consideration of process errors. Furthermore, it is possible to obtain a pseudo contour similar to an actual silicon image. In other words, a pseudo contour may be obtained to provide more exact information on shape and position of a metal line that will be formed through an actual fabrication process.

The retargeting process and the pseudo-contour formation process may be performed on the lower metal layout patterns in the same manner, and thus, a detail description thereof will be omitted in order to avoid redundancy.

Thereafter, a first weak edge RE1 may be detected, and the first and second pseudo contour patterns M21p and M22p may be used as a reference for detecting the first weak edge RE1. If a via pattern has such a first weak edge RE1, it may be classified or extracted as the first risk via V1r (in S123). In detail, the first weak edge RE1 may suffer from the third process risk. The first pseudo contour pattern M21p overlapped with the first risk via V1r may have the first edge SE1 facing the first weak edge RE1. In certain embodiments, the first risk via V1r with the first weak edge RE1 may have a portion protruding from the first edge SE1. Accordingly, a distance (e.g., a sixth distance L6) between the first weak edge RE1 and the first edge SE1 may have a negative value.

When viewed based on the first and second pseudo contour patterns M21p and M22p, the second via pattern V2 may be provided to be free from a process risk. In this case, the second via pattern V2 may not be classified as the risk via.

Referring to FIGS. 12 and 14, a position correction process may be performed to change a position of the first risk via V1r (in S124). For example, the first risk via V1r may be moved in an eighth direction D8. Since the second via pattern V2 does not have a process risk, the position of the second via pattern V2 may not be changed by the position correction process.

Here, the eighth direction D8 may be a direction that is not parallel to the first weak edge RE1 and is oriented toward the center of the first risk via V1r. For example, by moving the first risk via V1r in a direction perpendicular to the first weak edge RE1, it is possible to overcome the third process risk associated with the first weak edge RE1.

Thereafter, a design-rule check (DRC) may be performed (in S125). Here, the DRC may be performed to examine whether there is a process risk in an edge opposite to the first weak edge RE1. If there is no process risk, the corrected layout data (e.g., the corrected data for via patterns) may be output (in S126).

Figure 15:
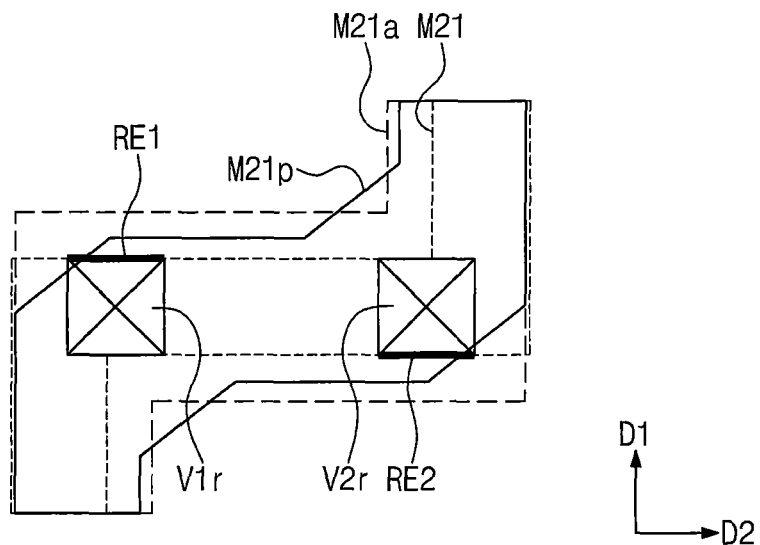
FIGS. 15 and 16 are plan views illustrating a method of correcting positions of via patterns, which are presented as an example of layout patterns for describing a method of designing a metal layout according to still other example embodiments of the inventive concepts.
Figure 16:
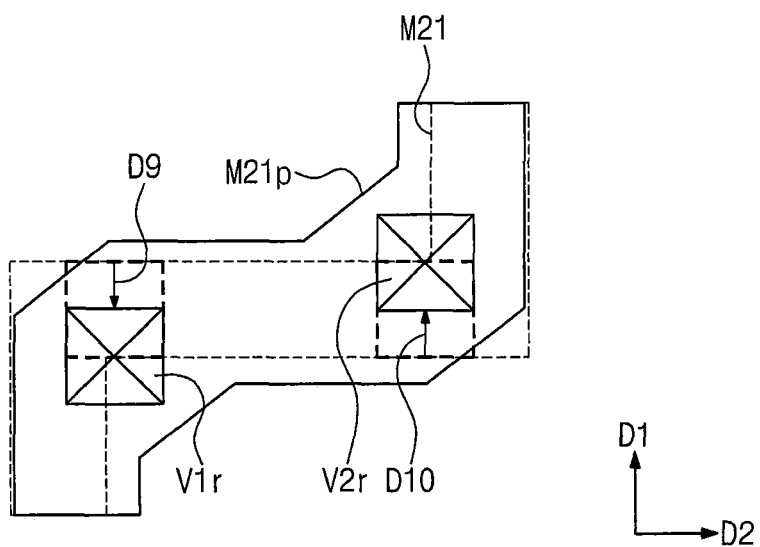

FIGS. 15 and 16 are plan views illustrating a method of correcting positions of via patterns, which are presented as an example of layout patterns for describing a method of designing a metal layout according to still other example embodiments of the inventive concepts. For example, FIGS. 15 and 16 may illustrate layouts for realizing a metal layer formed on a semiconductor substrate and vias provided therebelow. For concise description, elements previously described with reference to FIGS. 12 through 14 may be identified by a similar or identical reference number without repeating an overlapping description thereof.

Referring to FIGS. 12 and 15, upper metal layout pattern and via layout patterns may be provided. The upper metal layout pattern may include the first upper pattern M21. The first upper pattern M21 may include portions extending in the first direction D1 and a portion extending in the second direction D2. The via layout patterns may include two via patterns overlapped with the first upper pattern M21.

A retargeting process may be performed on the upper metal layout pattern, and as a result, the first deformed upper pattern M21a may be formed (in S122). Thereafter, a pseudo-contour formation process may be performed on the upper metal layout pattern, on which the retargeting process has been performed, and as a result, the first pseudo contour pattern M21p may be formed (in S122').

On the single object of the first pseudo contour pattern M21p, a plurality of via patterns may be extracted as risk vias (e.g., the first and second risk vias V1r and V2r) (in S123). For example, when the presence of the first pseudo contour pattern M21p is considered, the first weak edge of the first risk via V1r may suffer from the third process risk. Also, when the presence of the first pseudo contour pattern M21p is considered, the second weak edge of the second risk via V2r may suffer from the third process risk.

Referring to FIGS. 12 and 16, a position correction process may be performed to change positions of the first and second risk vias V1r and V2r (in S124). For example, the first risk via V1r may be moved in a ninth direction D9. The second risk via V2r may be moved in a tenth direction D10. Such movements of the first and second risk vias V1r and V2r may make it possible to reduce or prevent the third process risk from occurring in the first and second risk vias V1r and V2r.

Thereafter, a design-rule check (DRC) may be performed (in S125). Here, the DRC may be performed to examine whether there is a process risk in each of edges facing the first and second weak edges RE1 and RE2. If there is no process risk, the corrected layout data (e.g., the corrected data for via patterns) may be output (in S126).

Even if a plurality of via patterns on a single metal layout pattern are classified as the risk vias, the position correction process according to the present embodiment may make it possible for the risk vias to be respectively or independently moved using the same method as that described with reference to FIG. 6. Accordingly, compared with the method of moving risk vias with respect to a center of a metal layout pattern in the identical manner, it is possible to perform the position correction process with higher accuracy.

Figure 17:
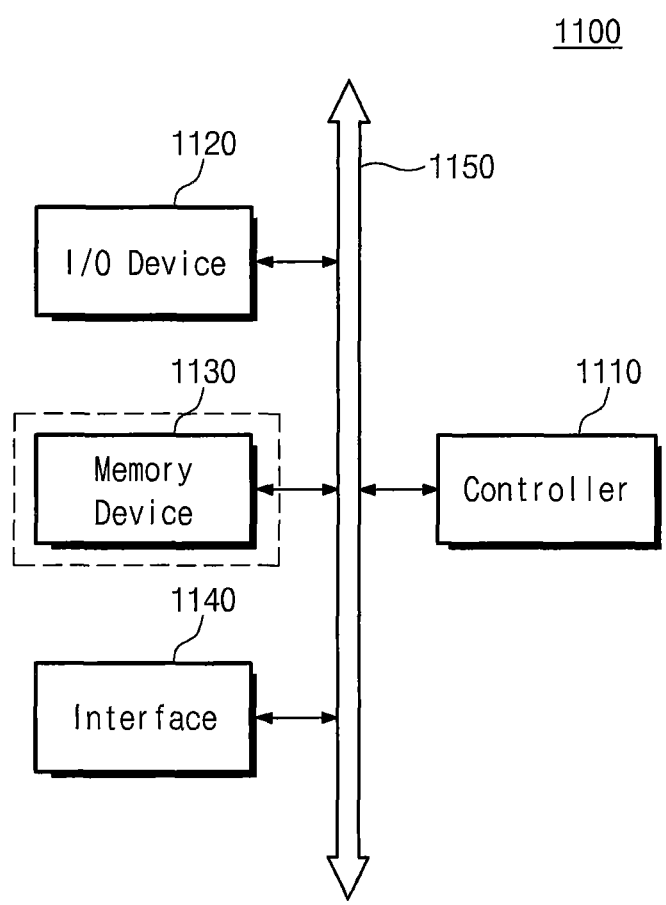
FIG. 17 is a block diagram illustrating an example of an electronic system including a semiconductor device according to example embodiments of the inventive concepts.

FIG. 17 is a block diagram illustrating an example of an electronic system including a semiconductor device according to example embodiments of the inventive concepts.

Referring to FIG. 17, an electronic system 1100 according to example embodiments of the inventive concepts may include a controller 1110, an input-output (I/O) unit 1120, a memory device 1130, an interface unit 1140, and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include a microprocessor, a digital signal processor, a microcontroller and/or another logic device, which is configured to have a similar function to them. The I/O unit 1120 may include a keypad, a keyboard and/or a display unit. The memory device 1130 may store data and/or commands. The memory device 1130 may include a nonvolatile memory device (e.g., a FLASH memory device, a phase-change memory device, a magnetic memory device, and so forth). Furthermore, the memory device 1130 may further include a volatile memory device. For example, the memory device 1130 may include a static random access memory (SRAM) device with the semiconductor device according to example embodiments of the inventive concepts. It may be possible to omit the memory device 1130, depending on the purpose of the electronic system 1100 or a type of an electronic product, for which the electronic system 1100 is used. The interface unit 1140 may transmit electrical data to a communication network or may receive electrical data from a communication network. The interface unit 1140 may operate in a wireless and/or wired manner. For example, the interface unit 1140 may include an antenna for the wireless communication and/or a transceiver for the wired and/or wireless communication. A semiconductor device according to example embodiments of the inventive concepts may be provided as a part of the controller 1110, the I/O unit 1120, the memory device 1130 and/or the interface 1140. Although not shown in the drawings, the electronic system 1100 may further include a fast DRAM device and/or a fast SRAM device that acts as a cache memory for improving an operation of the controller 1110.

Figure 18:
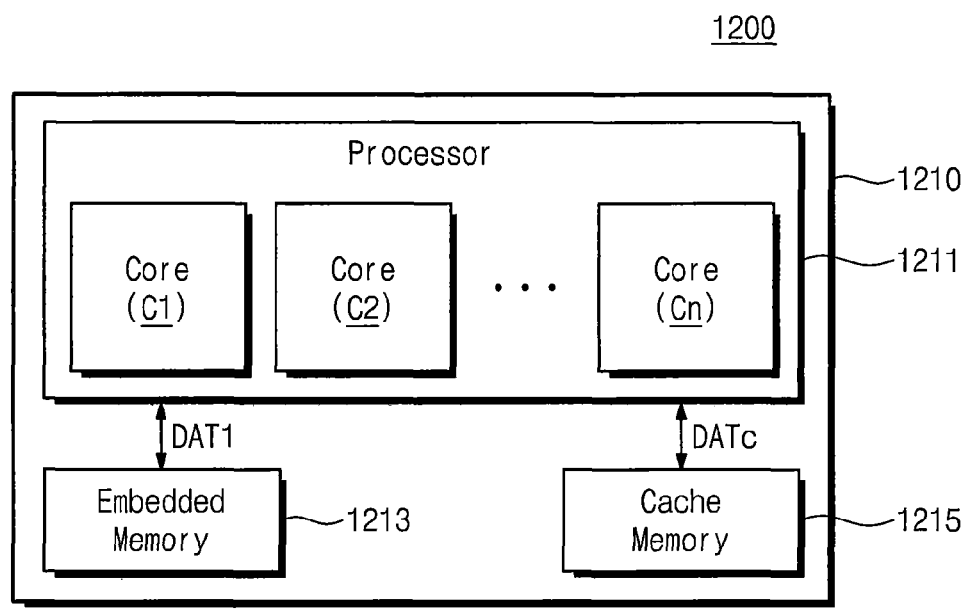
FIG. 18 is a block diagram illustrating an example of an electronic device including a semiconductor device according to example embodiments of the inventive concepts.

FIG. 18 is a block diagram illustrating an example of an electronic device including a semiconductor device according to example embodiments of the inventive concepts.

Referring to FIG. 18, an electronic device 1200 may include a semiconductor chip 1210. The semiconductor chip 1210 may include a processor 1211, an embedded memory 1213, and a cache memory 1215.

The processor 1211 may include one or more processor cores C1-Cn. The one or more processor cores C1-Cn may be configured to process data and signals. The processor cores C1-Cn may be configured to include the semiconductor device according to example embodiments of the inventive concepts (for example, a plurality of logic cells).

The electronic device 1200 may be configured to perform its own functions using the processed data and signals. As an example, the processor 1211 may be an application processor.

The embedded memory 1213 may exchange a first data DAT1 with the processor 1211. The first data DAT1 may be data processed, or to be processed, by the one or more processor cores C1-Cn. The embedded memory 1213 may manage the first data DAT1. For example, the embedded memory 1213 may be used for a buffering operation on first data DAT1. In other words, the embedded memory 1213 may be operated as a buffer memory or a working memory for the processor 1211.

In example embodiments, the electronic device 1200 may be used to realize a wearable electronic device. In general, the wearable electronic device may be configured to perform an operation of calculating a small amount of data, rather than calculating a large amount of data. In this sense, in the case where the electronic device 1200 is used for a wearable electronic device, the embedded memory 1213 may be configured to have a relatively small buffer capacity.

The embedded memory 1213 may be a static random access memory (SRAM) device. The SRAM device may have a faster operating speed than that of a dynamic random access memory (DRAM) device. Accordingly, in the case where the SRAM is embedded in the semiconductor chip 1210, it is possible for the electronic device 1200 to have a small size and a fast operating speed. Furthermore, in the case where the SRAM is embedded in the semiconductor chip 1210, it is possible to reduce an active power of the electronic device 1200. As an example, the SRAM may include at least one of the semiconductor devices according to example embodiments of the inventive concepts.

The cache memory 1215 may be mounted on the semiconductor chip 1210, along with the one or more processor cores C1-Cn. The cache memory 1215 may be configured to store cache data DATc that will be used or directly accessed by the one or more processor cores C1-Cn. The cache memory 1215 may be configured to have a relatively small capacity and a very fast operating speed. In example embodiments, the cache memory 1215 may include an SRAM device including the semiconductor device according to example embodiments of the inventive concepts. In the case where the cache memory 1215 is used, it is possible to reduce an access frequency or an access time to the embedded memory 1213 performed by the processor 1211. In other words, the use of the cache memory 1215 may allow the electronic device 1200 to have a fast operating speed.

To provide better understanding of example embodiments of the inventive concepts, the cache memory 1215 is illustrated in FIG. 18 to be a component separated from the processor 1211. However, the cache memory 1215 may be configured to be included in the processor 1211. In addition, example embodiments of the inventive concepts are not limited to the example illustrated by FIG. 18.

The processor 1211, the embedded memory 1213, and the cache memory 1215 may be configured to exchange or transmit data, based on at least one of various interface protocols. For example, the processor 1211, the embedded memory 1213, and the cache memory 1215 may be configured to exchange or transmit data, based on Universal Serial Bus (USB), Small Computer System Interface (SCSI), Peripheral Component Interconnect (PCI) Express, Advanced Technology Attachment (ATA), Parallel ATA (PATA), Serial ATA (SATA), Serial Attached SCSI (SAS), Integrated Drive Electronics (IDE), and/or Universal Flash Storage (UFS).

Figure 19:
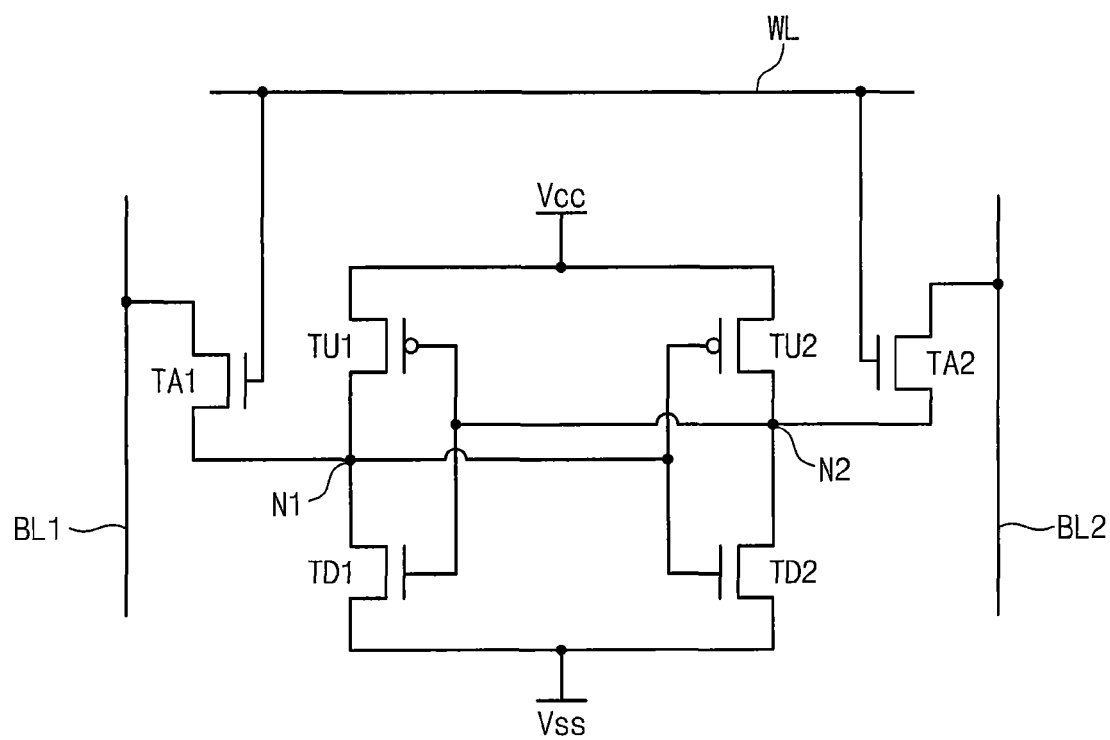
FIG. 19 is an equivalent circuit diagram illustrating an SRAM cell according to example embodiments of the inventive concepts.

FIG. 19 is an equivalent circuit diagram illustrating an SRAM cell according to example embodiments of the inventive concepts. The SRAM cell may be realized by at least one of the semiconductor devices according to example embodiments of the inventive concepts. The SRAM cell may be used for the embedded memory 1213 and/or the cache memory 1215 of FIG. 18.

Referring to FIG. 19, the SRAM cell may include a first pull-up transistor TU1, a first pull-down transistor TD1, a second pull-up transistor TU2, a second pull-down transistor TD2, a first access transistor TA1, and a second access transistor TA2. The first and second pull-up transistors TU1 and TU2 may be PMOS transistors, whereas the first and second pull-down transistors TD1 and TD2 and the first and second access transistors TA1 and TA2 may be NMOS transistors.

A first source/drain of the first pull-up transistor TU1 and a first source/drain of the first pull-down transistor TD1 may be connected to a first node N1. A second source/drain of the first pull-up transistor TU1 may be connected to a power line Vcc, and a second source/drain of the first pull-down transistor TD1 may be connected to a ground line Vss. A gate of the first pull-up transistor TU1 and a gate of the first pull-down transistor TD1 may be electrically connected to each other. Accordingly, the first pull-up transistor TU1 and the first pull-down transistor TD1 may constitute a first inverter. The mutually-connected gates of the first pull-up transistor TU1 and the first pull-down transistor TD1 may serve as an input terminal of the first inverter, and the first node N1 may serve as an output terminal of the first inverter.

A first source/drain of the second pull-up transistor TU2 and a first source/drain of the second pull-down transistor TD2 may be connected to the second node N2. A second source/drain of the second pull-up transistor TU2 may be connected to the power line Vcc, and a second source/drain of the second pull-down transistor TD2 may be connected to the ground line Vss. A gate of the second pull-up transistor TU2 and a gate of the second pull-down transistor TD2 may be electrically connected to each other. Accordingly, the second pull-up transistor TU2 and the second pull-down transistor TD2 may constitute a second inverter. The mutually-connected gates of the second pull-up transistor TU2 and the second pull-down transistor TD2 may serve as an input terminal of the second inverter, the second node N2 may serve as an output terminal of the second inverter.

The first and second inverters may be coupled with each other to form a latch structure. In other words, the gates of the first pull-up transistor TU1 and the first pull-down transistor TD1 may be electrically connected to the second node N2, and the gates of the second pull-up and second pull-down transistors TU2 and TD2 may be electrically connected to the first node N1. The first source/drain of the first access transistor TA1 may be connected to the first node N1, and the second source/drain of the first access transistor TA1 may be connected to a first bit line BL1. The first source/drain of the second access transistor TA2 may be connected to the second node N2, and the second source/drain of the second access transistor TA2 may be connected to a second bit line BL2. The gates of the first and second access transistors TA1 and TA2 may be electrically coupled to a word line WL. The SRAM cell according to example embodiments of the inventive concepts may have the afore-described structure, but example embodiments of the inventive concepts are not limited thereto.

Figure 20:
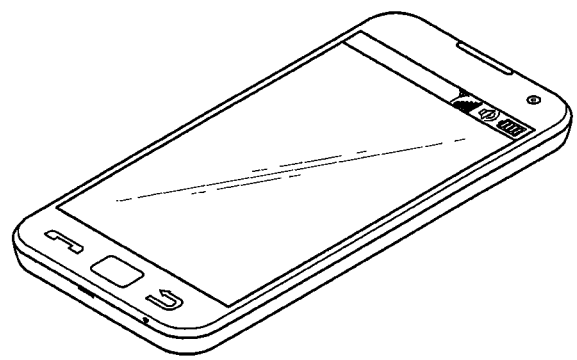
FIGS. 20 through 22 are diagrams illustrating some examples of a multimedia device including a semiconductor device according to example embodiments of the inventive concepts.
Figure 21:
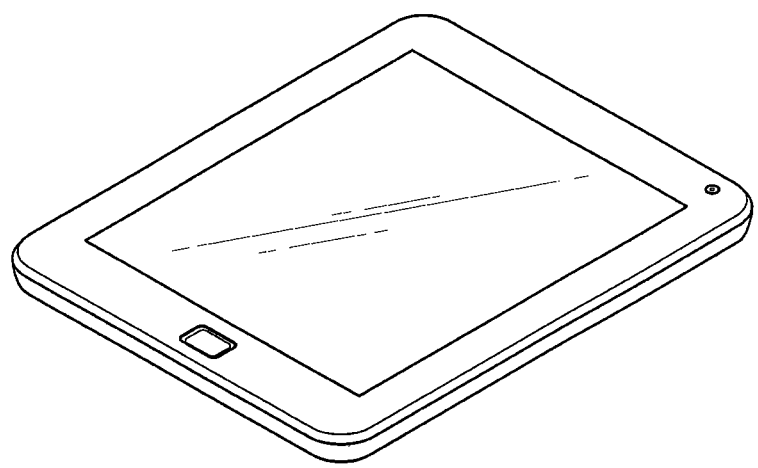
Figure 22:
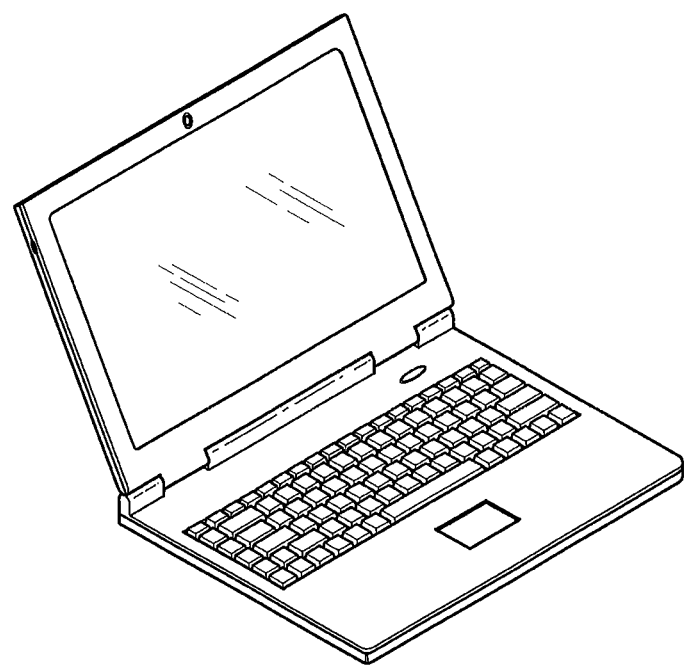

FIGS. 20 through 22 are diagrams illustrating some examples of a multimedia device including a semiconductor device according to example embodiments of the inventive concepts. The electronic system 1100 of FIG. 17 and/or the electronic device 1200 of FIG. 18 may be applied to a mobile or smart phone 2000 shown in FIG. 20, to a tablet or smart tablet PC 3000 shown in FIG. 21, or to a laptop computer 4000 shown in FIG. 22.

According to example embodiments of the inventive concepts, a method of designing a layout of a semiconductor device may include selectively extracting risk vias, which are likely to have a process risk, from via layout patterns and correcting positions of the risk vias with efficiency. Accordingly, in the case where the layout design method is used, it is possible to quickly correct positions of the via layout patterns and moreover to reduce a change in electric characteristics of a semiconductor device, which may be caused by the correction of the layout. Furthermore, it is possible to reduce a process risk.

While example embodiments of the inventive concepts have been particularly shown and described, it will be understood by one of ordinary skill in the art that variations in form and detail may be made therein without departing from the spirit and scope of the attached claims.

What is claimed is:

1. A method of designing a layout of a semiconductor device, comprising:
preparing a layout for a semiconductor integrated circuit, the preparing a layout comprising providing lower and upper metal patterns and via patterns that are interposed between the lower and upper metal patterns;

performing a retargeting process on the lower and upper metal patterns;

forming a pseudo contour from the lower and upper metal patterns, based on an etch skew;

classifying the via patterns based on the pseudo contour to extract at least one risk via from the via patterns, the at least one risk via being less than all of the via patterns;

changing a position of the at least one risk via;

manufacturing a photomask using the layout including the at least one risk via, the position of which was changed; and fabricating the semiconductor device from the photomask, wherein the at least one risk via is more susceptible to a fabrication process failure than at least one other of the via patterns.

2. The method of claim 1, wherein the classifying the via patterns comprises defining one of the via patterns as the at least one risk via, when a distance between a first edge of the one of the via patterns and a second edge of the upper metal pattern that overlaps the one of the via patterns is smaller than a predetermined distance or has a negative value, the first and second edges are parallel and adjacent to each other, and the negative value is a value when a portion including the first edge of the one risk via protrudes from the second edge.

3. The method of claim 1, wherein the classifying the via patterns comprises defining one of the via patterns as the at least one risk via, when a distance between the one of the via patterns and the lower metal pattern adjacent thereto is smaller than a predetermined distance.

4. The method of claim 1, wherein the classifying the via patterns comprises defining one of the via patterns as the at least one risk via, when a distance between the one of the via patterns and the upper metal pattern adjacent thereto is smaller than a predetermined distance.

5. The method of claim 1, wherein the classifying the via patterns comprises:

detecting a first weak edge, from edges of the via patterns; and defining one of the via patterns with the first weak edge as the at least one risk via, and the changing a position of the at least one risk via comprises moving the one of the via patterns with the first weak edge in a first direction that is not parallel to the first weak edge and is oriented toward a center of the one risk via.

6. The method of claim 5, wherein the one of the via patterns with the first weak edge further comprises a second weak edge, and the changing a position of the at least one via further comprises moving the one of the via patterns with the first weak edge and the second weak edge in a second direction that is not parallel to the second weak edge and is oriented toward the center of the one of the via patterns with the first weak edge and the second weak edge.

7. The method of claim 5, wherein a distance between the first weak edge and a side of the lower or upper metal pattern adjacent thereto is smaller than a distance that is determined based on a fabrication process failure risk.

8. The method of claim 5, further comprising performing a design-rule check on the one of the via patterns with the first weak edge, after the changing a position of the at least one risk via, the performing of the design-rule check comprising examining whether a distance between an edge of the one of the via patterns with the first weak edge facing the first weak edge and an edge of the lower or upper metal pattern adjacent to the edge is smaller than a distance that is determined based on a fabrication process failure risk, and the lower or upper metal pattern overlaps the one risk via.

9. The method of claim 8, further comprising further changing the position of the one of the via patterns with the first weak edge, when an additional fabrication process failure risk is found in the design-rule check.

10. The method of claim 1, wherein during the changing a position of the at least one risk via, all of the via patterns other than the at least one risk via, are unchanged in position thereof.

11. A method of designing a layout of a semiconductor device, comprising:

preparing a layout including lower and upper metal patterns and via patterns therebetween;

forming a pseudo contour from the lower and upper metal patterns based on an etch skew;

detecting a weak edge from edges of the via patterns, the weak edge having a fabrication process failure risk that is greater than that of at least one edge associated with other ones of the via patterns; and moving one of the via patterns with the weak edge in a direction that is not parallel to the weak edge and is oriented toward a center of the one of the via patterns;

manufacturing a photomask using the layout including the one of the via patterns with the weak edge that was moved in the direction; and fabricating the semiconductor device from the photomask;

wherein the fabrication process failure risk is based on the pseudo contour.

12. The method of claim 11, wherein the weak edge is a first weak edge and the detecting a weak edge comprises defining a first edge of the one of the via patterns as the first weak edge, when a distance between the first edge and a second edge of the upper metal pattern that overlaps the one of the via patterns is smaller than a predetermined distance or has a negative value, the first and second edges are parallel and adjacent to each other, and the negative value is a value, corresponding to an amount that a portion including the first edge of the one of the via patterns protrudes from the second edge.

13. The method of claim 11, further comprising defining the one of the via patterns with the weak edge as a risk via, wherein during the moving the risk via, all of the via patterns, other than the risk via, are unchanged in position thereof;

wherein the risk via is more susceptible to a fabrication process failure than at least one other of the via patterns.

14. A method of designing a layout of a semiconductor device that comprises first and second metal patterns and a via pattern therebetween that comprises vias, the method comprising:

changing a position of a subset of the vias in the via pattern, relative to remaining vias in the via pattern, based on a fabrication process failure risk factor, the subset including at least one, but less than all, of the vias in the via pattern;

forming a pseudo contour from the first and second metal patterns based on an etch skew;

manufacturing a photomask using the layout including the position of the subset of the vias in the via pattern that was changed; and fabricating the semiconductor device from the photomask, wherein the fabrication process failure risk factor is based on the pseudo contour.

15. The method of claim 14 wherein the fabrication process failure risk factor comprises a distance between an edge of a via in the via pattern and an edge of the first and/or second metal pattern that overlaps the via in the via pattern being less than a threshold.

16. The method of claim 14 wherein the changing comprises moving the position of a respective one of the vias in the subset toward a center of the respective one of the vias in the subset.

* * * * *